US 6,727,980 B2

(12) United States Patent
Ota et al.

(10) Patent No.: US 6,727,980 B2
(45) Date of Patent: Apr. 27, 2004

(54) APPARATUS AND METHOD FOR PATTERN EXPOSURE AND METHOD FOR ADJUSTING THE APPARATUS

(75) Inventors: Kazuya Ota, Tokyo (JP); Akikazu Tanimoto, Yokohama (JP); Tsuneyuki Hagiwara, Tokyo (JP); Hideki Komatsuda, Kawasaki (JP); Takashi Mori, Fujisawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/846,304

(22) Filed: May 2, 2001

(65) Prior Publication Data
US 2002/0041368 A1 Apr. 11, 2002

Related U.S. Application Data

(63) Continuation of application No. 09/396,349, filed on Sep. 14, 1999.

(30) Foreign Application Priority Data

Sep. 17, 1998 (JP) .............................. 10-262791
Sep. 22, 1998 (JP) .............................. 10-268197

(51) Int. Cl.⁷ ................... G03B 27/52; G03B 27/42; G03B 27/32; G02B 17/00; G03C 5/00
(52) U.S. Cl. .......................... 355/55; 355/35; 355/53; 355/67; 355/71; 355/77; 359/731; 359/859; 430/311; 430/5; 430/312; 356/399; 356/400
(58) Field of Search ................. 355/35, 53, 55, 355/67, 71, 77; 359/731, 859; 430/5, 311, 312; 356/399, 400

(56) References Cited

U.S. PATENT DOCUMENTS

| 4,165,180 A | * | 8/1979 | Failes |
| 4,900,694 A | | 2/1990 | Nakagawa ................... 437/109 |
| 5,262,257 A | | 11/1993 | Fukuda et al. .................. 430/5 |
| 5,506,684 A | | 4/1996 | Ota et al. .................... 356/401 |
| 5,953,106 A | | 9/1999 | Unno et al. .................... 355/55 |
| 5,981,001 A | | 11/1999 | Komatsu et al. ............. 427/582 |
| 6,142,641 A | * | 11/2000 | Cohen et al. |
| 6,399,261 B1 | * | 6/2002 | Sandstrom |

FOREIGN PATENT DOCUMENTS

| JP | A-57-85019 | 5/1982 |
| JP | 57-085019 | 5/1982 |

* cited by examiner

Primary Examiner—Frank G. Font
Assistant Examiner—Khaled Brown
(74) Attorney, Agent, or Firm—Oliff & Berridge, PLC

(57) ABSTRACT

A method for performing optical adjustments of an exposure apparatus is based on an exposure apparatus having a light source for generating illumination light for exposure, and illumination optics for irradiating a mask with the illumination light generated from the exposure light source so as to imprint a mask pattern on a substrate base. The apparatus uses a wide bandwidth light source for the exposure light source that produces exposure light and non-exposure light having wavelengths different from those in the exposure light, and optical adjustments for optical components in at least a portion of the illumination optics are performed by using non-exposure light

39 Claims, 14 Drawing Sheets

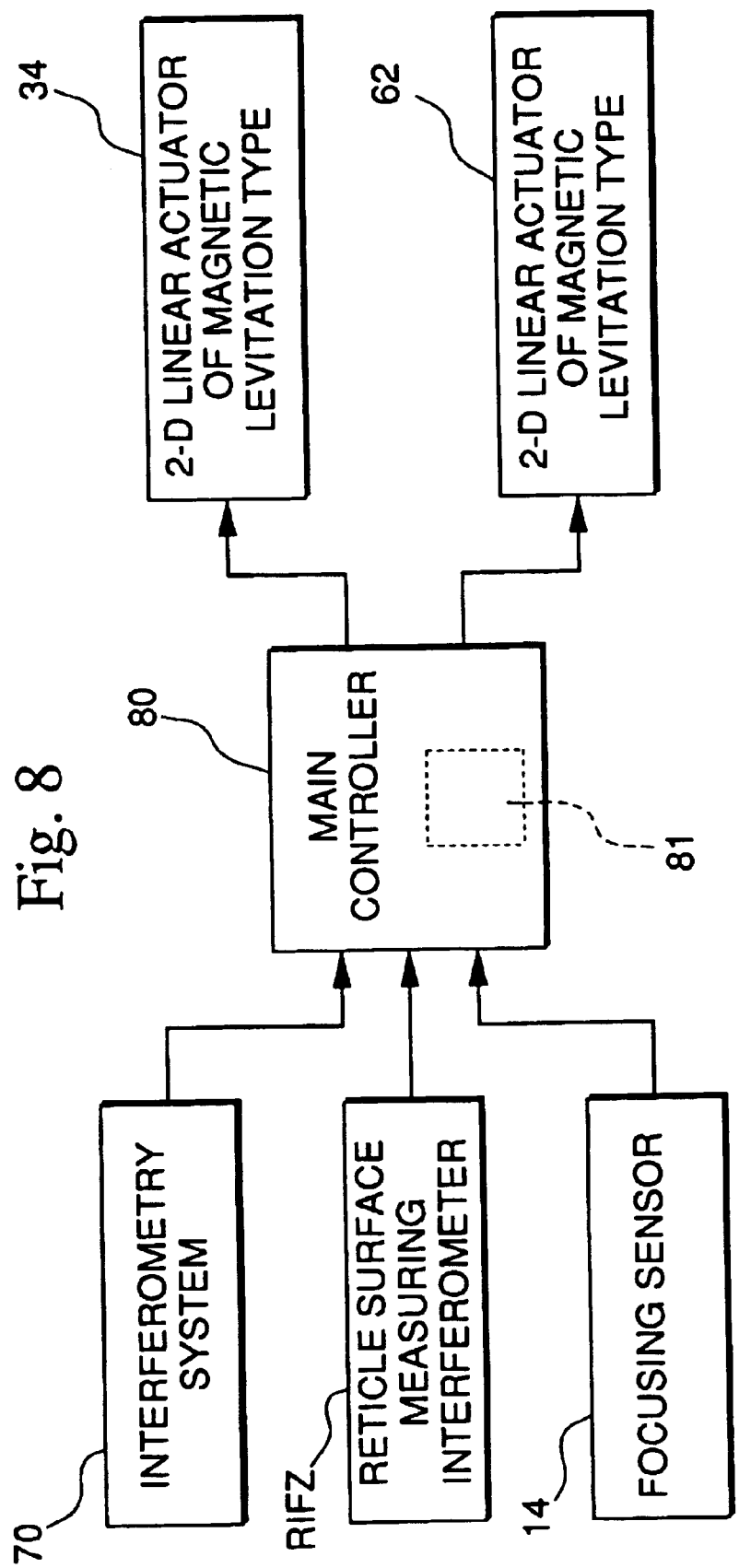

Fig. 13
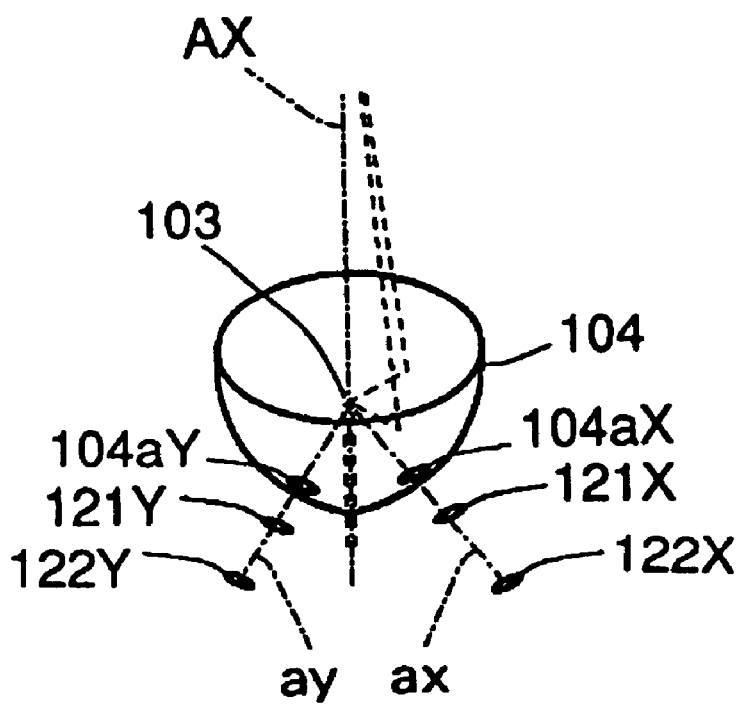
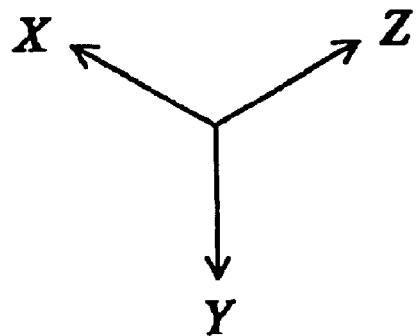

APPARATUS AND METHOD FOR PATTERN EXPOSURE AND METHOD FOR ADJUSTING THE APPARATUS

This is a Continuation of application Ser. No. 09/396,349 filed Sep. 14 1999. The entire disclosure of the prior application(s) is hereby incorporated by reference herein in its entirety.

BACKGROUND OF THE INVENTION

1. Field of the Invention

The present invention relates to an apparatus and a method for imprinting mask patterns using photolithography on a substrate base for making semiconductor devices, imaging devices (CCD), or liquid crystal display panels and the like, and also relates to a method for adjusting the exposure apparatus. In particular, the present invention relates to technology for exposing a pattern using illumination light such as extreme ultraviolet light (EUV light) such as soft x-rays.

2. Description of the Related Art

When manufacturing semiconductor devices, various apparatuses are used in photolithography for exposing a pattern, fabricated on a mask such as a reticle, on a wafer (or glass plate) as a substrate base. Traditionally, a base is coated with a photo-resist material and is exposed using a projection type apparatus such as a stepper, or a proximity type apparatus for imprinting a pattern directly on the base. In such apparatuses, ultraviolet light such as the i-line of a mercury lamp (365 nm wavelength), or far ultraviolet light (DUV) such as KrF excimer laser light (248 nm wavelength), has been used as illumination light (exposure light). In recent years, exposure apparatuses utilize other light sources, for example, far ultraviolet light such as ArF excimer light (193 nm wavelength) and vacuum ultraviolet light (VUV light) such as $F_2$ laser light (157 nm wavelength), have been developed to produce a higher degree of image resolution. Also, illumination or exposure light systems used for the traditional exposure apparatuses include refraction types and reflection/refraction types.

When using light sources in the ultraviolet region, it is not very efficient to use the exposure light for adjusting the optical systems in the illumination or exposure assembly from the initial primary adjustment stage to the final fine adjustment stage. Therefore, conventionally, a different exposure light, for example, a visible light source such as a He—Ne laser is used to perform primary adjustments using methods based on collimators or interferometers, and only the final adjustment is performed using the actual exposure light.

As described above, in the conventional methods based on using adjustment light source such as a visible light source, different from the exposure light source, it is necessary to arrange a special optical path for the adjustment light, using devices such as mirrors, so that the light path of visible adjustment beam coincides approximately with the light path of the exposure beam, so that it has been difficult to perform adjustments involving both the exposure light source and the illumination optics. For this reason, it has been difficult to improve the primary or rough adjustment process, resulting in increasing the time required for final or precise adjustment using the exposure light. There has been the drawback that the assembly time is increased. Furthermore, the exposure apparatus requires periodic maintenance of the illumination and exposure optics, but traditionally, the primary adjustment process performed during the periodic maintenance operation has been quite lengthy because of the special arrangement necessary for checking the illumination optics, such as positioning the guide mirrors, thus resulting in a complex and time-consuming operation.

Also, conventional illumination and projection systems are based on a refraction system or a reflective/refraction system, and because the wavelengths for the exposure light and for the visible light are widely separated, the primary adjustment process performed by using visible light for checking resulted in chromatic aberrations in the illumination and projection optics. Chromatic aberrations cause a large error in the rough adjustment results, and contribute to further lengthening the final adjustment task.

Especially, for the future production of even more microscopic semiconductor devices, development work is underway for an apparatus based on an exposure light of less than 100 nm in the extreme ultraviolet range (EUV light). When using EUV light for exposure, because of the large size of the exposure light source, there has been a need for an adjustment method that allows inclusion of the exposure light source for total optical adjustment of the exposure apparatus.

FIG. 14 shows an example of the projection apparatus based on soft x-rays for exposure light. A laser beam in the infrared range or visible range emitted from a laser source 201 is focused by a laser light focusing optics 201a on a focus point 203. An opening of a nozzle 202 is positioned in the vicinity of the focal point 203. A target substance such as a gaseous substance ejected from the nozzle 202 is excited by the high intensity laser light at the focal point 203, and the center portion of the target becomes a plasma, resulting in emission of soft x-ray light. Therefore, the emission point of the x-ray beam is the focal point 203. Simultaneously, infrared light, visible light, and ultraviolet light are generated as well as soft x-rays light.

The soft x-ray beam emitted from the focal point 203 is converted to a parallel beam by the first focusing optic 204 and the second focusing optic 205, and is focused by a condenser optic 207, and after deflecting its optical path by the flat mirror 207a, and is superimposed on a reflective type mask 208. The soft x-ray beam, reflected selectively by the pattern fabricated on the reflective mask 208, is led to the device surface 210 to be exposed by the projection optics 209, thereby imprinting the pattern of the mask 208 on the device surface 210. The portion of the apparatus required for the soft x-rays is located in an evacuated chamber 211 because of the low transmissivity of soft x-rays in air.

In such an apparatus, the nozzle 202 is subjected to some wear because of the plasma generated in its vicinity. Also, the first focusing optic 204 is subjected to contamination from particles worn off the nozzle 202, thus it is thought that the reflection properties may degrade with use. For this reason, it is necessary to replace the parts 202 and 204 periodically. When exchanging these parts, the new parts must be positioned exactly in their original positions. This is because, in the projection exposure technology field, even the slightest deviation in the illumination optical path will cause distortions in the projected image that demands the highest degree of optical precision.

However, because of the immature state of the current projection exposure technology based on soft x-rays as exposure light, there have been no suggestions of methods dealing with the positioning of replacement parts. It is desirable that the devices used in such replacement process should be as economical as possible in view of the fact that the overall projection exposure system is already extremely expensive.

SUMMARY OF THE INVENTION

It is an object of the present invention to provide a method for adjusting an exposure apparatus that enables to perform adjustments of internal optics quickly and efficiently.

Also, another object of the present invention is to provide a method for adjusting an exposure apparatus using EUV light for exposure that enables to perform adjustment of internal optics quickly and efficiently.

Further, still another object of the present invention is to provide an exposure apparatus designed for the method invented.

A first method is provided for performing optical adjustments on an exposure apparatus provided with: a light source that generates illumination light for exposure, and illumination optics that irradiates a mask with the illumination light and exposes a mask pattern on a substrate base using the illumination light. The method uses a wide bandwidth light source as the light source that generates an exposure light and a non-exposure light having wavelengths different from the wavelengths in the exposure light; and performs optical adjustments on optical components in at least a part of the illumination optics using the non-exposure light emitted from the wide bandwidth light source.

According to the first method, a portion of the optical components is adjusted using the non-exposure light emitted from the wide bandwidth light source so that optical adjustments can be performed precisely and quickly without relying on a separately provided light source for measuring purposes. Also, the non-exposure light is emitted from almost the same position as the exposure light (approximately coaxially) so that optical components can be adjusted with at the same precision needed for the actual exposure process.

A second method is provided for performing optical adjustments on an exposure apparatus provided with: a light source that generates illumination light for exposure, and illumination optics that radiates a mask with the illumination light and exposing a mask pattern on a substrate base using the illumination light. The method uses a wide bandwidth light source serving as the light source for generating exposure light and non-exposure light having wavelengths different from the wavelengths in the exposure light; performs primary optical adjustments for optical components in at least a part of the illumination optics using the non-exposure light; and performs final optical adjustments for the illumination optics using the exposure light emitted from the wide bandwidth light source.

According to the second method also, rough optical adjustments can be performed quickly and precisely without relying on a separately provided light source for measuring purposes. Therefore, adjustment errors are already minimized so that the final adjustments of the optical systems using the exposure light can be performed quickly.

In these case, it is preferable that the exposure apparatus is provided with projection optics comprised of reflective components for focusing illumination light exiting from a mask so as to imprint a pattern fabricated on the mask on a substrate base, and that adjustments of the optical components in at least a part of the illumination optics and the projection optics are performed using the non-exposure light emitted from the wide bandwidth light source. In the case where the projection optics consists of reflective components, the accuracy of the adjustment using the non-exposure light can be improved because there is no chromatic aberration.

A third method is provided for performing optical adjustments for an exposure apparatus provided with: a light source that generates illumination light for exposure; illumination optics that irradiates a mask with the illumination light; and projection optics that projects a pattern image of the mask on a substrate base. The method uses a wide bandwidth light source for generating illumination light for exposure light and non-exposure light having wavelengths different from the wavelengths in the illumination light; and adjusts at least a part of the projection optics using the non-exposure light. The third method can also perform optical adjustments quickly.

Evaluation methods for adjusting the projection optics may be made by observing a point image or a image space of a periodic pattern on a screen, or a point image may be defocused away from the screen to determine wave-plane aberrations. Any other measurement methods can also be used.

The wide bandwidth light source should generate ultraviolet light as exposure light (wavelengths in a range of 1~100 nm) and non-exposure light containing at least one of either ultraviolet light (of wavelengths in a range of 100~400 nm) or visible light (of wavelengths in a range of 400~800 nm). It is preferable that the illumination optics be comprised by reflective components. Reflective systems do not exhibit chromatic aberration so that the non-exposure light can perform precision optical adjustments. If the non-exposure light is ultraviolet light, simple detectors such as photo-diodes can be used readily, thus resulting in a low cost optical adjustment mechanism. If the non-exposure light is visible, the operator can visually follow the optical paths so that the adjustment process is facilitated.

Also, in the case where the non-exposure light is visible light or ultraviolet light having a wavelength no more than about 200 nm, it is possible to perform optical adjustments in a non-vacuum atmosphere, for example, in air, and the time for the adjustments can thereby be shortened. It is also possible to fill the optical path for non-exposure light with inert gas such as nitrogen or helium, instead of air. In this case, light having a wavelength no more than 200 nm can be used as non-exposure light.

A preferable example of the wide bandwidth light source is a laser plasma light source, and the exposure light is preferably an ultraviolet light of wavelength between 5~20 nm (EUV light). A laser plasma light source generates light of various wavelengths, by irradiating a target material, such as a copper tape, water drops, ice particles, xenon gas, or krypton gas, with a high power laser beam so that a high temperature plasma is generated. The plasma emits light of various wavelengths when it cools down. The energy of EUV light emitted from a laser plasma light source is deduced to be about 10% of the total energy of light irradiated on the target, and the remainder (about 90%) is emitted as light other than EUV light. In addition, the energy of the light to be used for exposure contained in the EUV light is deduced to be about 1~2% of the total energy of the light irradiated on the target.

The light other than the exposure light contains light having wavelengths that are very close to that of exposure light, and such light will be absorbed to generate heat by a laminated reflection mirror designed to reflect only a selected wavelength (for example, 13.4±0.1 nm or 11.5±0.1 nm, selected from among 5~20 nm). In contrast, visible light and ultraviolet light close in wavelength to visible light is reflected by the topmost layer in the laminated reflection mirror which contains substances such as Mo, Be, or Si so as to reach the illumination optics as well as the projection optics. Therefore, if a laser plasma light source is used, exposure light and non-exposure light can be emitted coaxially, and they are preferable for the exposure light source in the present invention.

Also, when optical systems are to be checked using non-exposure light, a gaseous substance (air for example) may be supplied in an optical path of the non-exposure light, and when using exposure light to perform adjustments or exposure, it is preferable to evacuate the optical paths of the exposure light. When the non-exposure light is either visible light or ultraviolet light having wavelengths close to visible light, air and the like supplied to the optical paths does not absorb energy and the adjustment process is facilitated. If the exposure light is EUV light, absorption is high and energy is absorbed if the optical path is not evacuated.

A first exposure apparatus for exposing a mask pattern onto a substrate base is comprised by: a light source that generates illumination light for exposure; and illumination optics that radiates illumination light emitted from the light source on a mask, wherein the light source is a wide bandwidth light source that generates exposure light and non-exposure light having wavelengths different from the wavelengths in the exposure light; and the exposure apparatus is provided with a photo-sensor that detects the non-exposure light that has passed through at least a part of optical components in the illumination optics. The output signals from the photo-sensors are used to enable the first or second method of adjustment of the present invention.

A second exposure apparatus for exposing a mask pattern onto a substrate base is comprised by: a light source that generates illumination light for exposure; and illumination optics that radiates illumination light emitted from the light source on a mask, wherein the light source is a wide bandwidth light source that generates exposure light and non-exposure light having wavelengths different from the wavelengths in the exposure light; and the exposure apparatus is provided with a photo-sensor that detects the non-exposure light that has passed through at least a part of optical components in the projection optics. This apparatus also enables the first or second method of adjustment of the present invention.

In these cases, it is preferable to provide a projection optics for projecting a mask pattern onto a substrate base by focusing the illumination light reflected by the mask. Furthermore, it is preferable that illumination optics and projection optics are comprised by reflective systems, and include stage devices for moving a mask and a substrate base in a given direction; and a control device for scanning the mask and the substrate base concurrently with respect to projection optics, so as to imprint a mask pattern on the substrate base. When the projection optics is reflective, chromatic aberration is eliminated and a good focusing area is formed in an arc shape. A step-and-scan method can then be used to perform exposure over a wide shot area on the substrate base.

Also, it is preferable to provide a wavelength selection device for transmitting one of either exposure light or non-exposure light emitted from the wide bandwidth light source towards the illumination optics side.

Further, if exposure light emitted from the wide bandwidth light source is EUV light, other emitted light having a wavelength longer than EUV light, for example 100~300 nm, may be used to exposure rough layers or middle layers requiring less precision, so that the EUV light may be used to expose critical layers requiring a higher precision. This procedure allows the present apparatus to be used for a variety of applications.

According to the present method of performing optical adjustments of the exposure apparatus, a light source should generate exposure light as well as non-exposure light so that quick and precise adjustment can be provided for the internal optical components without relying on a separately provided light source for adjustment purposes.

When exposure light is extreme ultraviolet light (EUV) and the illumination optics are reflective, and if the projection optics provided are also reflective, because chromatic aberration is not produced, the use of the non-exposure light can provide quick and precise optical adjustments of the internal optical components.

Also, the present exposure apparatus enables use of the present method of optical adjustments.

On the other hand, another purpose of the present invention is to present a technique using a low cost device for positioning optical components near x-ray generating devices in an exposure apparatus using x-rays as exposure light.

In this case, soft x-rays used as exposure light may be chosen from two kinds of x-rays. One type is emission light from a synchrotron and the other is plasma x-rays, especially those emitted from a plasma excited by laser irradiation.

Emission light from a synchrotron has known problems, such as the expense of the light source, bulky equipment, and because a single source produces x-rays used for several exposure apparatuses, if a problem develops in the single source, all the exposure apparatuses stop operating. Therefore, plasma x-ray devices are regarded as the most suitable type of light source. Therefore, the present invention relies on plasma x-rays.

In order to position newly installed devices in the correct position with respect to the emission point, it is necessary to maintain the relative position of the light source (emission point) with respect to the optical systems. To enable such a process, it is essential to measure where the emission point is. However, optical equipment based on x-rays, all parts of the equipment including the optical paths and the detector devices, tends to be expensive because of its unusual wavelength. Therefore, the present invention focuses attention on the type of light source most suitable for the purpose.

A light source for generating plasma x-rays operates by focusing light energy on a particular point to generate x-rays, therefore, visible light is produced from the same point as the x-rays. Therefore, by observing the emission point of visible light, the emission point for x-rays can be determined. In order to determine the relative position between the light source and the optics, it is sufficient to observe the position of the light source through the optics.

The present invention is achieved based on the above point of view. That is, the exposure apparatus of the present invention comprises an x-ray source that generates x-rays by generating a plasma from a substance so as to use x-rays generated from the x-ray source as exposure light, a light source position observation system is provided to form an image of the x-ray source using light other than x-rays, for example visible light, generated concurrently with the x-rays from the x-ray source.

Another method of the present invention for adjusting an exposure apparatus is a method for positioning an x-ray source for emitting exposure light, comprised by the steps of: generating x-rays from an x-ray source that produces x-rays by generating a plasma of a substance; and positioning the x-ray source using light other than x-rays, for example visible light, generated concurrently with the x-rays.

Another exposure method according to the present invention is a method which uses an x-ray source which generates x-rays by generating of a plasma of a target substance and uses the x-ray as exposure light; and the method adjusts the position of the x-ray source using light other than the x-rays, such as visible light, generated by the x-ray source concurrently with the x-rays; and then performing an exposure process.

According to each of the methods presented above, in an exposure apparatus using x-rays, especially laser plasma x-rays, as a light source for exposure, it is possible to provide high precision in replacing optical components relating to the light source, and furthermore, those parts that are required to realize the present invention have low cost.

Also, the present invention is not limited only to switching of components, and can be also applied to the reposition of optical components in exactly the position required, for example, when they shift their position with use.

BRIEF DESCRIPTION OF THE DRAWINGS

FIG. 8 is a block diagram of the control system for controlling the position and orientation of the wafer stage and reticle stage.

FIG. 13 is a perspective view of a variation of the emission position detection system.

DESCRIPTION OF THE PREFERRED EMBODIMENTS

Preferred embodiments will be presented in the following with reference to the drawings.

Embodiment 1

Figure 1:
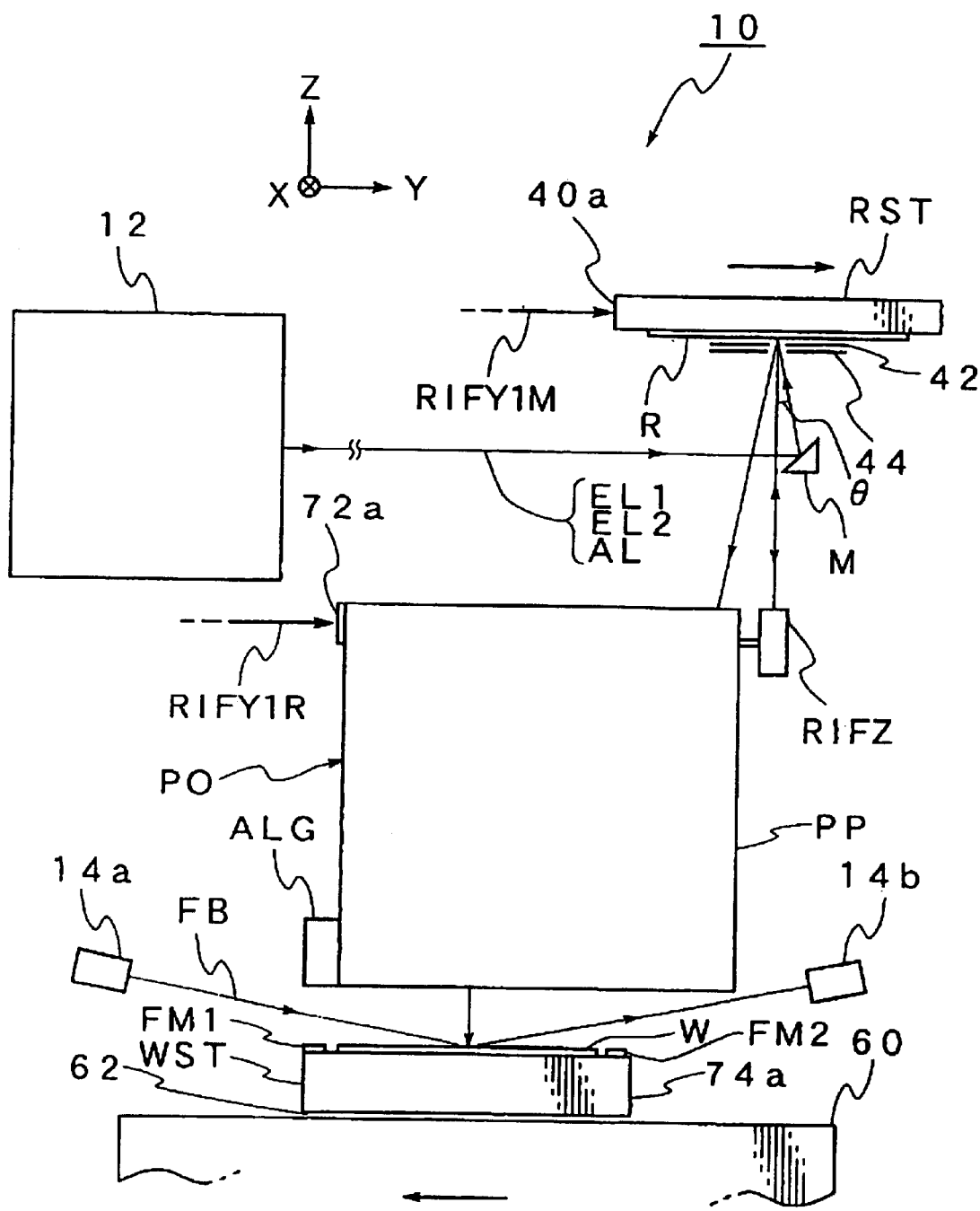
FIG. 1 is a schematic diagram of the structure of an exposure apparatus in the first embodiment.

FIG. 1 shows a schematic overall view of the exposure apparatus 10 in Embodiment 1. The exposure apparatus 10 is a reducing projection type, and performs the step-and-scan method of scanning exposure by using illumination light containing many wavelengths. However a particular range of wavelengths when used for exposure is referred to, in the following presentation, as exposure light, EUV light EL1, whose wavelengths are in the range of 5~20 nm in the soft x-ray exposure region. In this embodiment, the projection optics PO focuses the main beam of the light flux reflected from the reticle R, serving as a mask, essentially vertically onto the wafer W. Therefore, in the following descriptions, the line of projection of the EUV light reaching the wafer W in the projection optics PO is referred to as the optical axis of the projection optics PO (i.e. z-axis), and the planes orthogonal to the z-axis are respectively referred to as y-axis (left/right on the paper in FIG. 1) and x-axis (vertical to the paper in FIG. 1). The projection optics PO comprises a telecentric optic system on its image surface side (wafer side), and a non-telecentric optic system on its subject surface side (reticle side).

The exposure apparatus 10 imprints a reduced image of the entire circuit pattern on the reticle R in each shot area of a plurality of shot areas on the wafer W, using the step-and-scan method, by moving the reticle R and the wafer W in one direction (in this case, y-direction in FIG. 1) with respect to the projection system PO (EUV light EL1) while projecting an image of a portion of the circuit pattern fabricated on the reticle R on the wafer W through the projection system PO.

The exposure apparatus 10 is provided with a light source device 12 for emitting exposure light from a light source of a wide bandwidth. In addition to emitting exposure light, EUV light EL1, the light source device 12 has a capability of emitting ultraviolet (UV) light EL2 of wavelengths between 100~400 nm as well as visible light AL of wavelengths between 400~700 nm. UV light EL2 and visible light AL correspond to non-exposure light. EUV light EL1, UV light EL2 and visible light AL are emitted horizontally (in y-direction in FIG. 1) from the same position in the light source device 12 (that is, coaxially).

Exposure apparatus 10 comprises: a loop back mirror M (a part of the illumination optics) for reflecting EUV light EL1 from the light source device 12 so that the EUV light EL1 is incident upon the pattern surface of the reticle R at a specific angle θ (about 50 mrad in this case); a reticle stage RST for holding the reticle, which serves as mask stage; projection optics PO consisting of reflection optics for directing the reflected light from the pattern surface of the reticle R on the wafer W; a substrate stage WST for holding the wafer W; focus sensors 14a, 14b; and an alignment optics ALG for detection of alignment markings.

Figure 2:
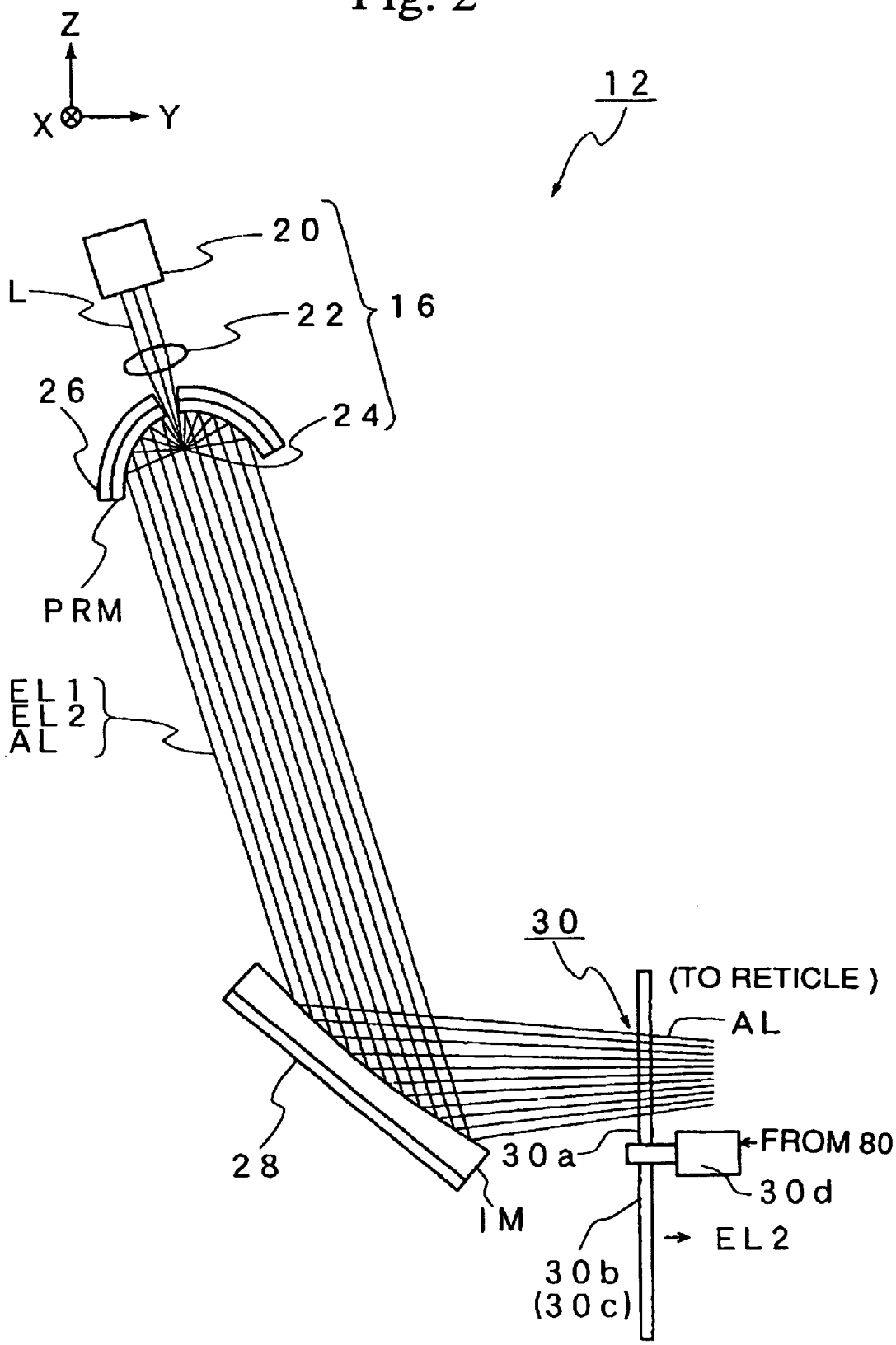
FIG. 2 is a schematic diagram of the light source used for the apparatus shown in FIG. 1.

As shown in FIG. 2, the light source device 12 comprises: a laser plasma source 16 to serve as the exposure light source of a wide bandwidth; and parts PRM, IM which are included in the illumination optics. Laser plasma source 16 comprises a laser source 20 of high power output such as a YAG laser and excimer laser; a condensing lens 22 for focusing the laser light L at a focal point; and an EUV generating substance (target) 24 such as copper tape placed at the focal point.

Here, an arrangement for generating EUV light is briefly explained below. Laser light output from the high-power laser source 20 is focused on the EUV generating substance 24 placed at the focal point of the condensing lens 22, the substance 24 is heated to a high temperature by the laser power, and reaches a state of generating a plasma, and while transiting to lower potential states, emits EUV light EL1 used as exposure light, UV light EL2 and visible light AL as well as light of other wavelengths.

Because the EUV light EL1 thus generated radiates in all directions, a parabolic mirror PRM is provided inside the light source device 12, which converts EUV light EL1 into a parallel light flux. An EUV reflection layer is formed on the inside surface of the parabolic mirror PRM, and the back surface is cooled by an attached cooling device 26. The EUV reflection layer reflects visible light Al and UV light EL2 of wavelength longer than about 100 nm. Liquid coolant for cooling is most desirable for use in the cooling device 26 from the standpoint of cooling efficiency, but the cooling medium is not limited to liquid coolant. Metallic materials are suitable for the parabolic mirror PRM from the standpoint of thermal conductivity. It is known that it is possible to reflect a specific wavelength only, by using as the EUV reflective layer a laminated reflection layer composed of two kinds of materials. For example, it is known that EUV light having a wavelength of about 13 nm can be selectively reflected by using a laminated layer consisting of several tens of layers of molybdenum (Mo) and silicon (Si) alternating at an interval of 6.5 nm. Also, several tens of layer of Mo and beryllium (Be) alternating at an interval of 5.5 nm will selectively reflect EUV light having a wavelength of about 11 nm. Although it is also possible to selectively reflect EUV light having a wavelength of about 13 nm by using a laminated layer consisting of several tens of layers of Mo and Be alternating at an interval of 6.5 nm, the reflectance thereof is less than that of the case where several tens of layer of Mo and Si alternating at an interval of 6.5 nm.

Those waves generated by the EUV generating substance 24 but which are not reflected by the EUV reflection layer are absorbed in the lamination layer etc. and converted to heat, thus raising the temperature of the parabolic mirror PRM. The cooling device 26 is therefore needed to cool the parabolic mirror PRM. Each of the EUV light EL1, UV light EL2 and visible light AL can be reflected by the parabolic mirror PRM so as to respectively produce parallel light, of a circular cross sectional shape, having a uniform distribution of optical power.

The light source device 12 is further provided with an illumination mirror IM which reflects the parallel light, such as EUV light EL1, towards the loop back mirror M shown in FIG. 1, and a wavelength selection device 30 (see right bottom corner of FIG. 2), which processes the light reflected from the illumination mirror IM. The wavelength selection device 30 comprises: optical filters 30a, 30b that alternately cross the optical path of the reflected light from the illumination mirror IM; an EUV light selection plate 30c (not shown); and a drive motor 30d for selectively placing either the optical filters 30a, 30b or the EUV light section plate 30c in the optical path. The optical filter 30a transmits only the visible light AL in the light reflected from the illumination mirror IM while the optical filter 30b transmits only the UV light EL2. The optical filters 30a, 30b serve as interference filters for a wavelength to match a substrate material, for example a glass.

The EUV light selection plate 30c blocks UV light EL2 and visible light AL and transmits only EUV light EL1. The EUV reflection films in the lamination layer show very sharp selectivity for the wavelengths in the vicinity of the EUV light so as to selectively reflect only the wavelength needed for exposure, and visible light and UV light are similarly reflected. If such lights are directed to the reticle R or to the projection optics PO, there is danger of heating the reticle R or mirrors (these will be explained later) contained in the projection optics PO due to the extra energy provided by such lights. In the worst case, extraneous light reaching the wafer W may actually degrade the image quality.

The illumination mirror IM, as shown in FIG. 2, has a curved surface for receiving EUV light EL1, whose surface is coated with a laminated layer comprised by alternating layers of two types of materials (for example, several tens of layers of Mo and Si). It is designed so that the reflected light, including EUV light EL1, UV light EL2 and visible light AL, will form a narrow slit shape on the reticle R.

In FIG. 2, the vertical direction is transverse to the direction of light propagating to the reticle R to form an arc shaped illumination area IA (similar in shape to a sector of a ring light, see FIG. 5) for illuminating the pattern surface on the reticle R, which is the focal plane. However, because the light sources for EUV light EL1 and others have certain sizes, the shape of the image formed on the focusing plane of the reticle R has a finite width dimension of the order of 1 to 10 mm, which is not too narrow to produce the arc shaped illumination area. The illumination mirror IM is also provided with a cooling device 28 similar to the cooling device 26 described above.

Figure 3:
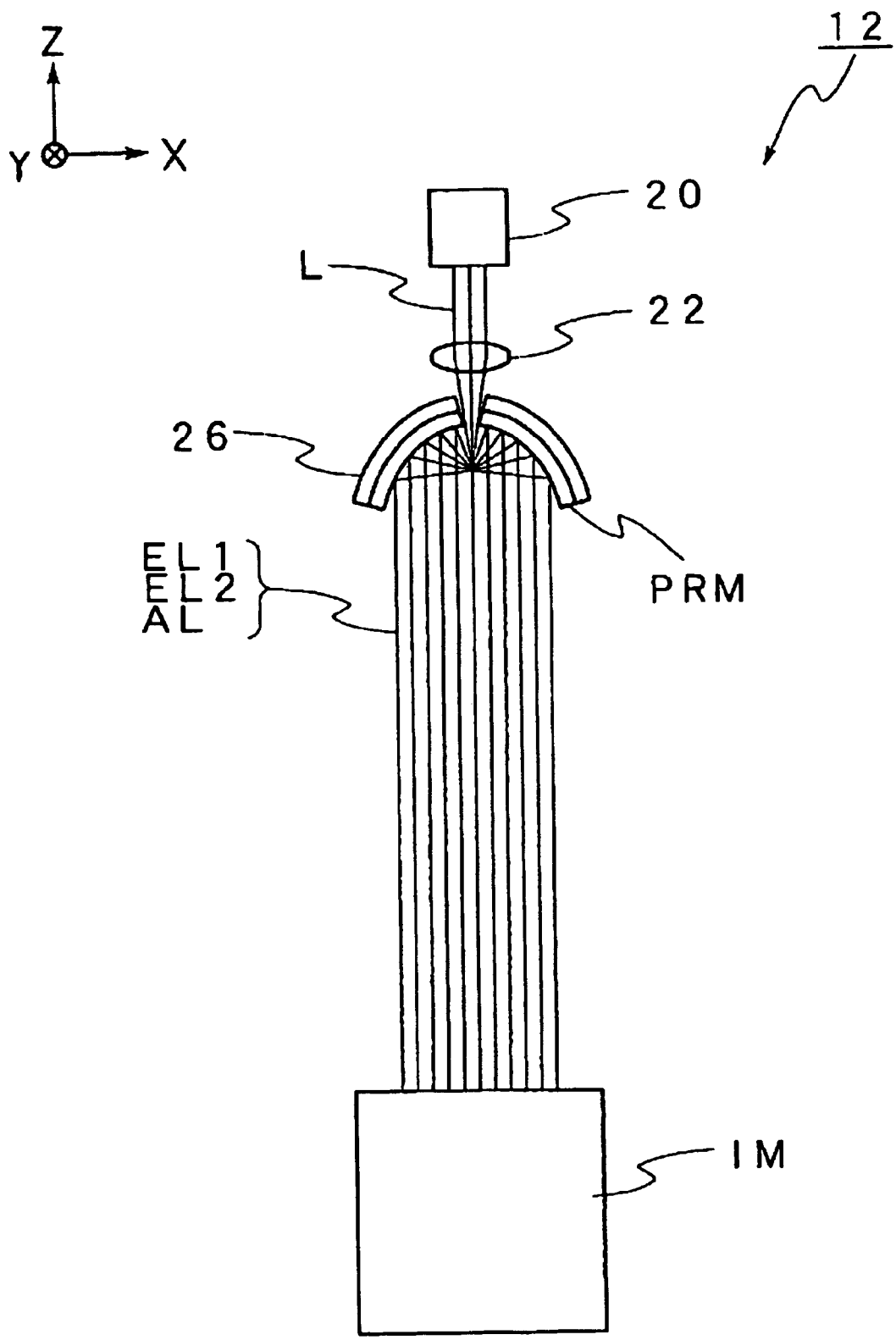
FIG. 3 is a left side view of the light source shown in FIG. 2.

FIG. 3 shows a view of the light source device 12 seen in the −y-direction (from the left in FIG. 2). The loop back mirror M is located behind the plane of the paper. Although the reflection surface of the illumination mirror IM does not appear in FIG. 3, the reflection surface has a rectangular shape when seen from the back of the plane of the paper of FIG. 3. The reflection surface of the illumination mirror IM appears as a curved shape in FIG. 2 and as a rectangle in FIG. 3 showing the left side view, therefore, the reflection surface of the illumination mirror IM has the same shape as a part of the inside surface of a cylinder. Therefore, illumination light including EUV light EL1, is seen to focus at a point in FIG. 2, but in FIG. 3, it remains as parallel light propagating from left to right in the longitudinal direction. Although it remains as parallel light, because the size of the light source is finite, the spatial coherency is not zero.

Figure 4:
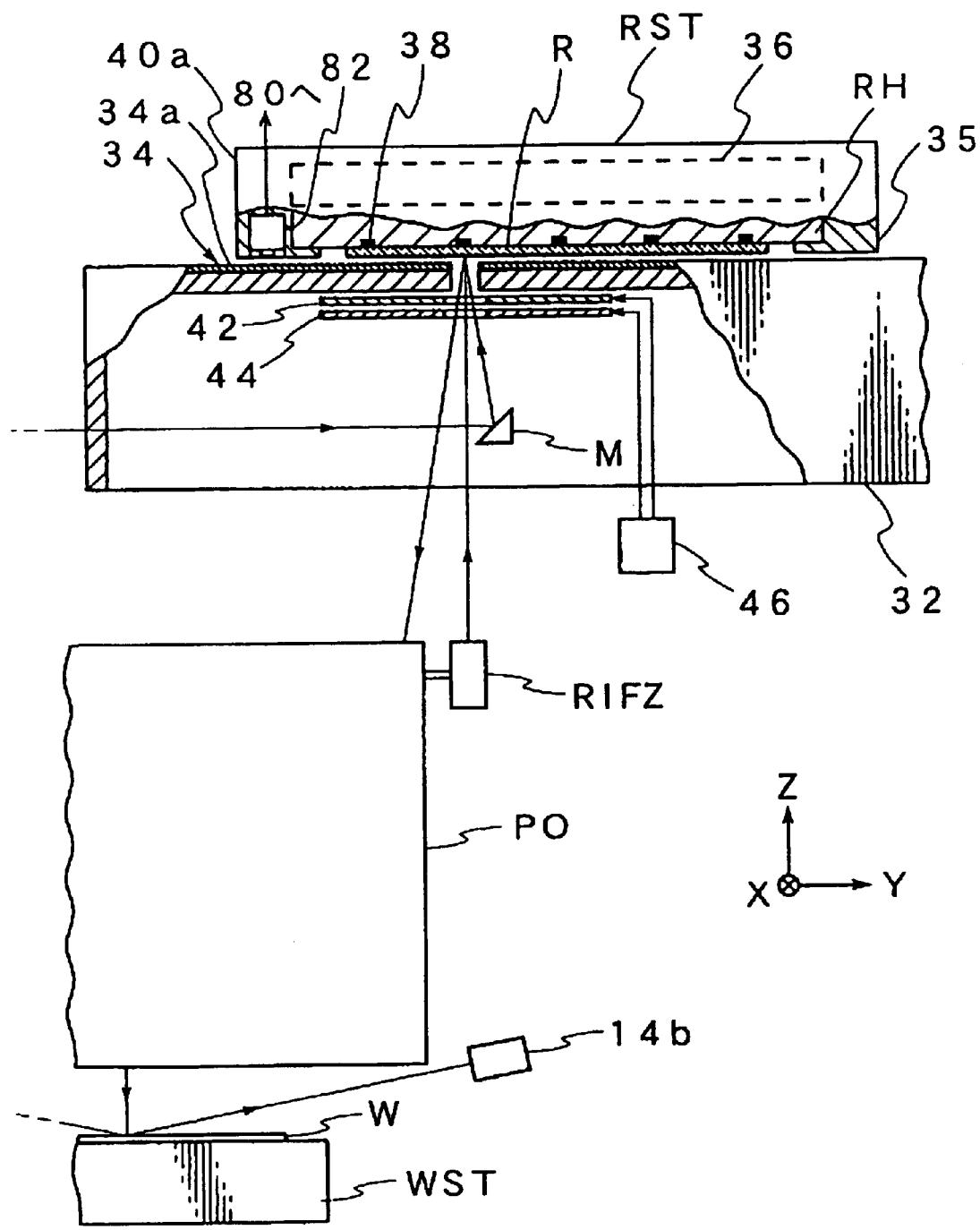
FIG. 4 is a partial schematic diagram of the structure in the vicinity of the reticle stage shown in FIG. 1.

Returning to FIG. 1, although not shown in FIG. 1, but reticle R is actually placed on a reticle stage base 32, lying on the x-y plane as shown in FIG. 4, which is levitated by means of a 2-dimensional (2-D) linear actuator 34 of the magnetic levitation type. The reticle stage RST is driven in the y-direction by the actuator 34 for a given distance, and can be micro-driven in the x-direction as well as in the θ-direction (rotation about z-axis). The reticle stage RST can also be micro-driven in the z-direction and in a slanted direction with respect to the x-y plane by means of the actuator 34.

The 2-D linear magnetic levitation type actuator 34 is comprised by a permanent magnet (not shown) located on the bottom section of the periphery of the reticle stage RST and coils 34a distributed in a 2-D x-y space above the reticle stage base 32. A main controller 80 controls the electrical current flowing in the coils 34a to control the position and orientation of the reticle stage RST in 6-D. This will be explained later.

The reticle stage RST is comprised by, as shown enlarged in FIG. 4, a reticle holder RH for holding a reticle R opposite to the reticle stage RST; a stage body 35 for holding the peripheries of the reticle holder RH; and a temperature control section 36 for maintaining the temperature of the reticle holder RH disposed on the back surface (top surface side) of the reticle holder RH. The reticle holder RH operates as a static electricity chuck. This is because a vacuum chuck cannot be used due to the fact that the exposure apparatus 10 is placed inside a vacuum chamber, which is not shown. The material for the reticle holder RH can be any of the low expansion glass and ceramics that are used for making the conventional DUV exposure apparatus.

A plurality of temperature sensors 38 are disposed at a specific spacing on the suction surface of the reticle holder RH to precisely measure the temperature of the reticle R, and the temperature control section 36 controls, based on the measured temperature, the temperature of the reticle R at predetermined target temperature. The cooling device for this purpose can be based on heat exchange methods involving liquid cooling through a flexible tube introduced from outside, electronic devices such as Peltier elements, or heat exchanging devices such as heat pipes.

An imaging device 82, sensitive to visible light AL, having a photo-sensors 82a (refer to FIG. 5) arranged in 1-D in the x-direction which is a non-scanning direction perpendicular to the scanning direction, is disposed so as to distance it from the bottom surface of the reticle stage RST in y-direction. Imaging signals from the imaging device 82 are supplied to the main controller 80. The photo-sensor surface of the imaging device 82 is at the same height as the pattern surface of the reticle R. Further, as shown in FIG. 6, a reference member 83 having a reflection film 83a, comprised by a line of dots, is disposed so as to distance away it the bottom surface of the reticle stage RST in the y-direction, at the same height as the pattern surface of the reticle R for reflecting visible light AL. The dot-lined reflection film 83a is used as a point source of light for visible light AL during the optics adjustment operation.

Returning to FIG. 4, the −y-direction lateral surface of the reticle stage RST is mirror polished to form a reflection surface 40a for reflecting light in the visible range. Although not shown in FIG. 4, mirror polishing is similarly provided on the −x-direction lateral surface of the reticle stage RST for reflecting visible light. And, similar to the conventional exposure apparatus having a DUV light source, the position of the reticle stage RST in the x-y plane, and the rotational parameters, such as the amounts of pitching, rowing, and yawing, are controlled, in the present exposure apparatus, by using an interferometric system based on illuminating the reflection surface 40a with a measuring beam.

The surface (pattern surface) of the reticle R has a reflection film for reflecting EUV light EL1. The reflection film is comprised by a lamination having two kinds of substances in alternating layers. In this case, the reflection film comprised by alternating layers of Mo and Si has a 70% reflection factor for EUV light EL1 of about 13 nm wavelength. An original pattern on the reticle R is made by coating a material for absorbing EUV light over the entire surface of the reflection film and fabricating a pattern on the coating. Although repairing of a failed pattern is not possible when the pattern is formed by a reflection substance film such as lamination, problems on a pattern produced on an absorptive material can be corrected. Most of existing materials are not reflective of EUV light and are useable for making the absorption layer. In this embodiment, because a laser interferometer is used to measure the position of the reticle R in the z-direction, the absorption layer is made of a material, that reflects visible light used as a measuring beam, having a reflection factor no less than that of the reflection layer. Other criteria for selecting the material for making the absorption layer include ease of patterning, good adhesion to the reticle R and resistance to oxidation with use.

Figure 5:
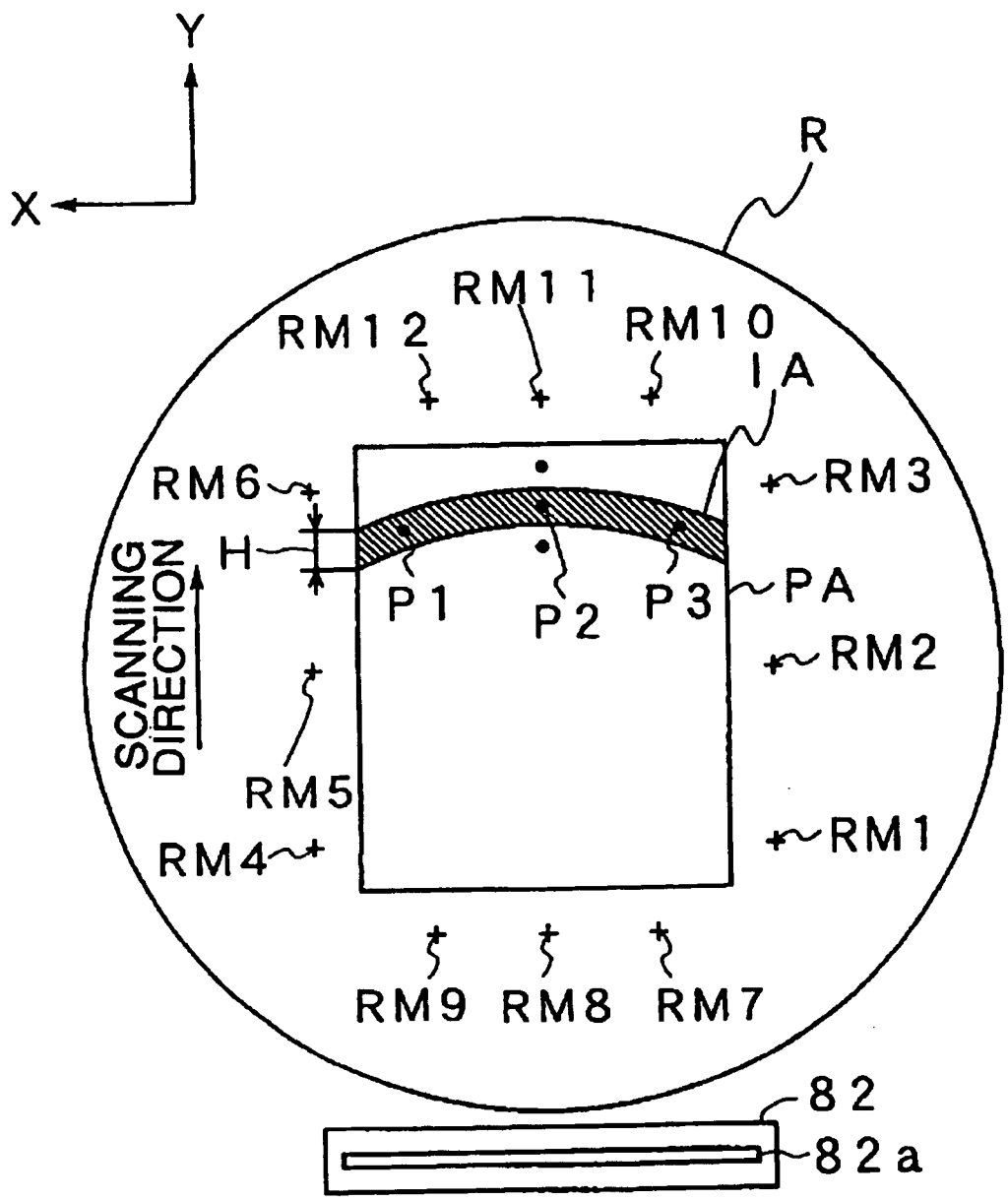
FIG. 5 is a schematic plan view of the reticle.
Figure 6:
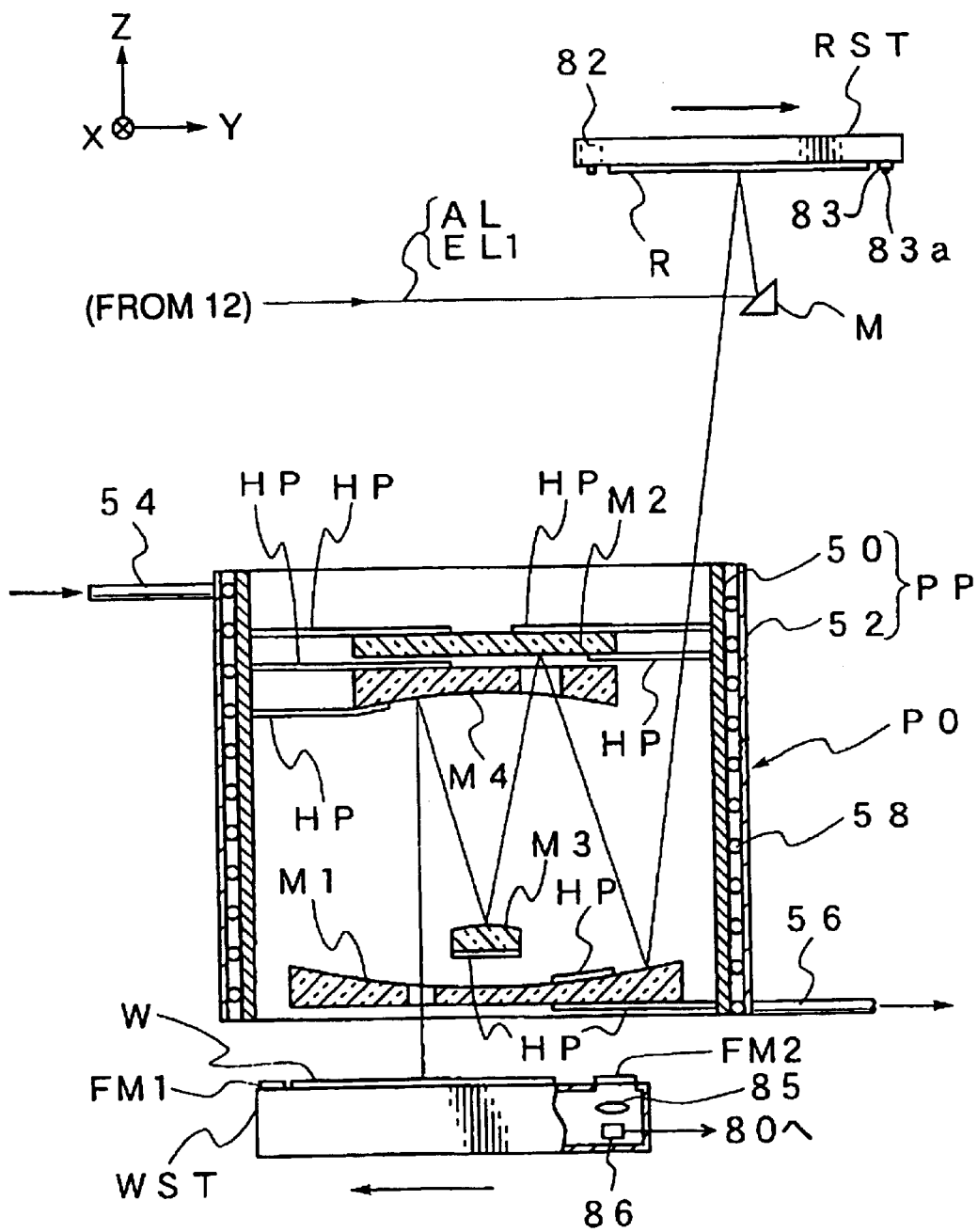
FIG. 6 is a schematic cross sectional view of the internal structure of the projection optics of the apparatus shown in FIG. 1.

FIG. 5 shows an example of the reticle R. The central rectangular region is the pattern area PA. The arc-shaped hatched region is the illumination area IA radiated by the exposure light, EUV light EL1. The reason for using an arc shaped illumination area IA for exposure is to use only the area having least effects of various optical aberrations in the projection optics PO. Reticle alignment marks RM1~RM6, spaced apart along the y-direction, are provided on the ends of the pattern area PA in the x-direction for positioning purposes. Reticle alignment marks RM1, RM4 and RM2, RM5 and RM3, RM6 are disposed in the x-direction. As can be seen in FIG. 5, when using the arc-shaped exposure area IA, simultaneous exposure (static exposure) is not possible so that scanning exposure is used. This process will be explained later.

The material for making the reticle R is not particularly limited because its surface is coated with a reflection layer. The material for making the reticle R includes low expansion glasses, quartz glass, ceramics, silicon wafer and the like. A reference for selecting the reticle material is to use the same material for both reticle R and the reticle holder RH. In such a case, an advantage is that the differential thermal expansion can be minimized because both reticle R and the reticle holder RH change size at the same rate when the temperature rises as a result of irradiation by an exposure light. The same effect can be obtained by using two different materials but having the same thermal expansion coefficients. For example, Si for the reticle R and silicon carbide (SiC) for the reticle holder RH may be considered. An advantage of using Si for making the reticle R is that various processing apparatuses for Si such as patterning apparatuses, coating apparatuses and etching apparatuses, which are conventionally used in manufacturing process of semiconductor devices, can be utilized directly for making the reticle R. In this embodiment, Si is used for making the reticle R for these reasons, and the reticle holder is made of SiC.

Returning to FIG. 1, a movable blind 42 and a slit plate 44 for aperture control are disposed close to the bottom side of the reticle R (input side of EUV light EL1). Specifically, as shown in FIG. 4, the movable blind 42 and slit plate 44 are disposed inside the reticle stage base 32.

The slit plate 44, in FIG. 4, defines the arc-shaped illumination area IA (refer to FIG. 5), so that it may be made immobile in relation to the projection optics PO, but in this embodiment, the slit plate 44 is made mobile by switching mechanism 46 which includes the drive motor. The slit plate 44 is comprised by: a first slit for defining the arc-shaped illumination area IA on the reticle R formed by the exposure light EUV light EL1; and a second slit for defining the illumination area formed on both ends of the pattern area PA on the reticle R that includes alignment marks RM1, RM4 (or RM2, RM5, or RM3, RM4). The drive mechanism 46 switches the slit plate 44, according to instructions from the main controller 80 (refer to FIG. 8) so that the EUV light EL1 will radiate on the illumination area IA during the exposure period, and radiate on the area to include the alignment marks during the positioning operation for the reticle R.

The movable blind 42 shown in FIG. 4 is used to block projecting the redundant circuit provided inside the reticle R, for example, when it is not desired to imprint the redundant circuit, and in this embodiment, the main controller 80 controls the drive mechanism 46 so that the movement of the movable blind 42 in y-direction synchronizes with the movement of the reticle stage RST in y-direction. The start of the movable blind 42 may coincide with the scanning action of the reticle R, or may coincide with the arrival of the redundant pattern to be shielded.

Returning to FIG. 1, projection optics OP uses only reflective components (mirrors), and in this embodiment, the projection ratio is ¼. Therefore, the exposure light EUV light EL1, containing the pattern information on the reticle R, is reduced by ¼ in the projection optics PO and is projected onto the wafer W.

Here, the projection optics PO will be explained in more detail with reference to FIG. 6. The projection optics PO are comprised by: four reflective components (a first mirror M1, a second mirror M2, a third mirror M3, and a fourth mirror M4) for reflecting EUV light EL1, UV light EL2, visible light Al; and a housing tube PP for housing the four mirrors M1~M4. The first mirror M1 and fourth mirror M4 have a spherical reflection surface, and second mirror M2 has a flat reflection surface while the third mirror M3 has a spherical reflection surface. The reflection surfaces are designed and produced to a precision of less than 1/50 to 1/60 of the exposure wavelength. Variation is held to within an RMS value (standard deviation) of 0.2 nm to 0.3 nm. The material for making the mirrors is glass or metal having a low thermal expansion coefficient, and the surface having a reflection layer comprised by two kinds of alternating layers made in the same manner as the reticle R. When the wavelength of the EUV light EL1 is about 13 nm, the reflective layers formed on the reticle R and the mirrors M1~M4 are preferably made by molybdenum (Mo) and silicon (Si), and, when the wavelength is about 11 nm, the reflective layers are preferably made by molybdenum (Mo) and beryllium (Be).

As shown in FIG. 6, a throughhole is provided in the fourth mirror M4 so that the light reflected at the first mirror M1 can reach the second mirror M2. Similarly, a throughhole is provided in the first mirror M1 so that the light reflected from the fourth mirror M4 can reach the wafer W. It is obvious that the holes may be replaced with suitably shaped mirrors, such as mirrors having notches, so that the light flux can pass through.

When using EUV light EL1 for exposure, because of the presence of a vacuum around the projection optics OP, there is little heat removal for removing heat generated by the exposure light. Therefore, in this embodiment, the mirrors M1~M4 and the housing tube PP housing the mirrors M1~M4 are connected by heat pipes HP and the housing tube PP is cooled by a cooling device. The housing tube PP has a double-wall construction and is comprised by an inner mirror supporter 50 and an outer cooling jacket 52, and the interior space between the outer (jacket) tube 52 and the mirror supporter 50 is filled with a spiral cooling pipe 58 which admits a cooling medium from the input tube 54 and drains from an outlet tube 56. In this case, the cooling medium is water. Cooling water discharged from the interior space of the cooling jacket 52 through the outlet tube 56 is passed through a heat exchanger (not shown), and after it is cooled to a certain temperature, it is re-circulated by returning it through the inlet tube 54 to the cooling pipe 58 interior space of the cooling jacket 52.

Therefore, in the present projection optics PO, heat generated on the mirrors M1~M4 by the exposure light EUV light EL1 is removed through the heat pipes connected to the housing tube PP which is maintained at a constant low temperature to maintain the temperature of the mirrors M1~M4 at the same temperature. The heat pipes are bonded not only to the back surfaces of the four mirrors M1~M4 but also to their front surfaces where they are not affected by the exposure light, therefore cooling is much more effective compared with the case of cooling only the back surfaces. Here, the heat pipes provided on back side of third mirror M3 and on the front side of first mirror M1 are connected to the inside surface of the housing tube PP at the back side of the plain of the paper in FIG. 6. The external appearance of the housing tube PP is a square cylindrical shape.

Returning to FIG. 1, the wafer stage WST is placed on top of a wafer stage 60 disposed along the x-y plane, and is levitated above the wafer stage base 62 by means of a 2-D actuator 62 of the magnetic levitation type. The wafer stage WST is driven in the x-direction by the actuator 62 for a given distance, and can be micro-driven in the x-direction and the y-direction as well as in the θ-direction (rotation about z-axis). The wafer stage WST can also be micro-driven in the z-direction and in a slanted direction with respect to the x-y plane by means of the actuator 62.

The 2-D linear magnetic levitation type actuator 62 is comprised by a permanent magnet (not shown) located on the bottom section of wafer stage WST and coils (not shown) distributed in a 2-D x-y space above the wafer stage base 60. A main controller 80 controls the current flowing in the coils to control the position and orientation of the reticle stage RST in 6-D. This will be explained later.

A wafer holder (not shown) of a static chucking type is placed on the top surface of the wafer stage WST so as to retain the wafer W on the wafer holder. Also, the lateral surface in +y-direction of the wafer stage WST in FIG. 1 is mirror polished to produce a reflection surface 74a to reflect visible light AL. Also, although not shown in FIG. 1, on the lateral surface in the x-direction of the wafer stage WST is also provided with a mirror polished reflection surface for reflecting visible light. In the present exposure apparatus 10, an interferometer system is used to radiate a measuring beam on the reflection surface 74a and the other reflection surface to determine the stage position precisely with respect to the projection optics PO.

On one end of the top surface of the wafer stage WST, an image space measuring instrument FM1 (refer to FIG. 1), for use with EUV light EL1, is provided for determining the image position of a pattern formed on the reticle R projected on the wafer W as well as the relative position of the alignment optics ALG (so-called baseline measurement). The image space measuring instrument FM1 is equivalent to the reference mark plate for the conventional DUV exposure apparatus. A image space measuring instrument FM2 for use with visible light AL is provided near the wafer W on the wafer stage WST.

Figure 7A:
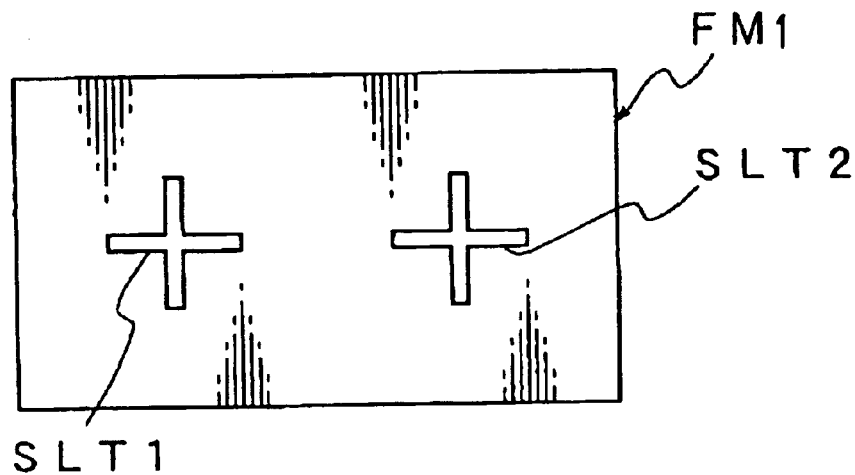
FIG. 7A is a plan view of a spatial image instrument FM1.
Figure 7B:
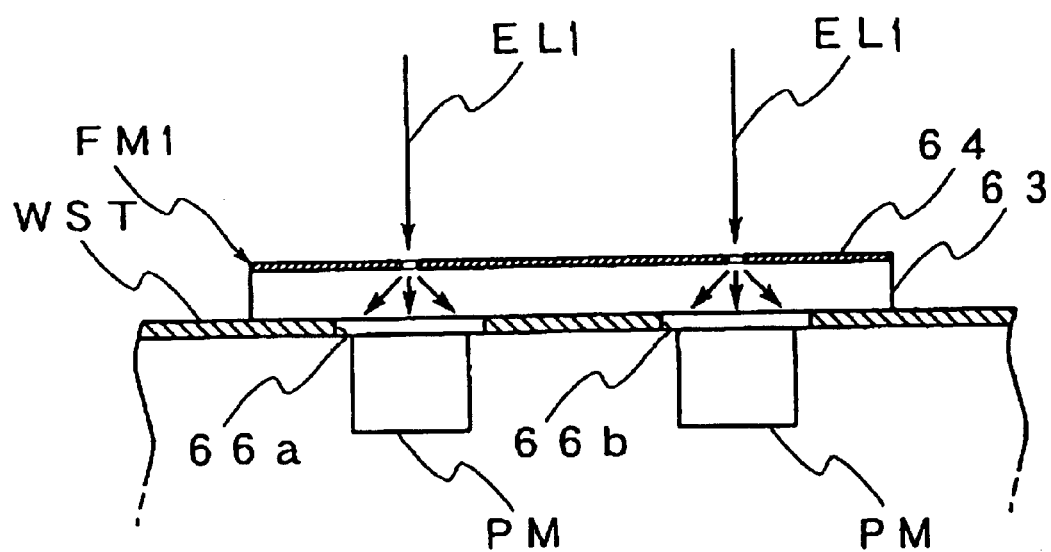
FIG. 7B is a partially exposed side view of FIG. 7A.

FIGS. 7A, 7B show, respectively, a plan view and a vertical cross sectional view of the image space measuring instrument FM1. As shown in these drawings, slit openings SLT1, SLT2 are provided on the top surface of the image space measuring instrument FM1. These slits SLT1, SLT2 are patterned in a reflection layer 64 for EUV light, which is formed on the upper surface of the fluorescent material 63 of a certain thickness. The fluorescent material 63 is fixed on the upper surface of the wafer stage WST. Instead of the reflection layer 64, an EUV absorption layer may be provided and the openings may be fabricated on the absorption layer.

On the upper plate of the wafer stage WST located below the slits SLT1, SLT2, openings 66a, 66b are respectively formed, and on the interior of the wafer stage WST opposite to the openings 66a, 66b, respective photo-conversion devices PM such as photo-multipliers are disposed. Therefore, when EUV light EL1 is radiated from the top potion of the projection optics PO into the image space measuring instrument FM1, EUV light EL1 passes through the slits SLT1, SLT2 strikes the fluorescent material 63 which emits a radiation of a wavelength longer than the EUV wavelength. The fluorescence light input in the photo-conversion devices PM is converted into electrical signals of strength corresponding to the light intensity. Output signals from the photo-conversion devices PM are also supplied to the main controller 80. The positions of the slits SLT1, SLT2 correspond roughly to the positions of the reticle alignment marks RM1, RM2 (or RM2, RM5 or RM3, RM6) disposed on the reticle R in x-direction, so that, during the reticle alignment process to be described later, both the slits SLT1, SLT2 and the reticle alignment marks RM1, RM4 can be measured concurrently.

As shown in FIG. 6, the image space measuring instrument FM2 for visible light is a glass substrate plate for transmitting visible light, and is attached to the wafer stage WST so that the glass surface is coplanar with the wafer surface. Below the image space measuring instrument FM2, a condensing lens 85 and a 2-D imaging device 86 of the CCD type responsive to visible light is disposed opposite to an opening so that an enlarged image produced by visible light AL on the surface of the image space measuring instrument FM2 will be formed on the imaging device 86 by the condensing lens 85. Imaging signals from the imaging device 85 are also supplied to the main controller 80.

Next, the position measuring system in the present exposure device will be explained. The positions of the reticle stage RST in x-, y- and rotational directions are measured by laser interferometry as explained above. In this case, the y-coordinates of the reticle stage RST are determined with respect to the position of the projection optics PO by means of the laser beam RIFY1R directed to the reference mirror 72a and the laser beam RIFY1M directed to the lateral surface 40a of the reticle stage RST, and similarly, the x-coordinates and rotation angles of the reticle stage RST are determined by means of laser interferometry with respect to the position of the projection optics PO. Similarly, the positions of the wafer stage WST in the x-, y- and rotational directions are measured by the laser interferometry with respect to the position of the projection optics PO. The interferometry system 70 shown in FIG. 8 is comprised by a laser interferometer for the reticle stage RST and a laser interferometer for the wafer stage WST, and the measured value of the interferometry system 70 is transmitted to the main controller 80.

Referring further to FIG. 1, the housing tube PP which serves as the reference for all the measurements for the interferometry system 70 is provided with a laser interferometer RIFZ for measuring the position of the reticle R in z-direction. Although only one laser interferometer RIFZ is shown, but in fact, three laser interferometers of the same structure are attached to the housing tube PP at three locations which are suitably separated.

As shown in FIGS. 1 and 4, each of the measuring beams output from respective three laser interferometers RIFZ is radiated on the pattern surface of the reticle R at one of three different points in the irradiation regions (that is, the arc-shaped illumination area IA) of EUV light EL1 which radiates on the pattern surface of the reticle R at a certain angle of incidence θ by reflected at the loop back mirror M. Each of the measuring beams propagates through an optical path in z-direction, and the optical path in this case corresponds to the center point between the incident light path and reflection light path of various beams including EL1. Therefore, the laser interferometer RIFZ injects the measuring beams to the pattern surface of the reticle R while preventing the measuring beams from influencing the exposure beam such as EUV light EL1 which is input on the reticle surface at a certain angle of incidence θ and is reflected by the reticle surface at the same angle as the incidence. Furthermore, it is also possible to prevent the exposure beam such as EUV light EL1 from influencing on the measuring beams. Therefore, the position measurement precision for reticle R in z-direction is high (for example, less than 1 nm to several nm).

The laser interferometer RIFZ used in this embodiment is made as an internal mirror type interferometer comprising an internal mirror (not shown), and determines the position of the point irradiated with the measuring beam on the reticle R in z-direction, using the position of the internal mirror as the reference position. In making such measurements, the measuring beams output from the No.1~No.3 laser interferometers RIFZ are directed to respective points P1, P2 and P3 within the illumination area IA shown in FIG. 5. Point P2 is the center of the illumination area IA, i.e., it is on the central axis of the pattern area PA in the x-direction as well as at the center of the illumination area IA in the y-direction. Points P1, P3 are symmetrically placed with respect to the central axis.

As shown in FIG. 8, measurement results obtained by the tri-axial measurement of the reticle surface by the laser interferometers RIFZ are supplied to the main controller 80, which controls the z-direction position and inclination of the reticle stage RST (i.e. reticle R) by means of the 2-D linear actuator 34 according to the tri-axial measurement results.

On the other hand, the position of the wafer W in the z-direction with reference to the housing tube PP shown in FIG. 1 is determined by focus sensors 14a, 14b of a slanted incidence angle type attached to the projection optics PP. The focus sensors 14a, 14b are fixed to a column (not shown) holding the housing tube PP and are comprised by: an input beam system 14a to inject a detection beam FB at a slanted angle to the surface of wafer W; and a beam detection system 14b to detect a beam FB reflected at the wafer W. The focus sensors used in this embodiment are the multi-focus detection sensors disclosed, for example, in a Japanese Patent Application, First Publication, Hei 6-283403 and its corresponding U.S. Pat. No. 5,448,332. It is important that the focus sensors 14a, 14b be integrally attached to the housing tube PP. In FIG. 8, these sensors 14a, 14b are represented by one focus sensor 14, and the main controller 80 controls the z-direction position and inclination of the wafer stage RST (i.e. wafer W) by means of the 2-D linear actuator 62 according to the measurement results produced by the focus sensor 14. The contents of the U.S. Pat. No. 5,448,332 are incorporated by reference in this application.

The main controller 80 shown in FIG. 8 is comprised by a microcomputer (or a work station) and has an internal memory (RAM) 81. In this embodiment, drive devices are constituted by the main controller 80 and the magnetic levitation type 2-D linear actuators 34, 62.

Next, an example of optical adjustment operation during assembly of the exposure apparatus will be explained with reference to the flowchart shown in FIG. 9. Referring to FIGS. 1 and 2, the illumination optics are comprised by the parabolic mirror PRM, illumination mirror IM, loop back mirror M, movable blind 42 and slit plate 44. In other words, all the optical components in the illumination optics are reflective systems comprised by mirrors, and similarly the projection optics PO serving the projection task is also reflective. Therefore, no chromatic aberration is produced in any of the light used in the projection optics PO, i.e., EUV light EL1, UV light EL2 and visible light AL, thus allowing the use of visible light AL to perform primary adjustments for the illumination and projection optics systems during assembly of the exposure apparatus. Visible light AL can also be used for performing optical adjustments during the scheduled periodic maintenance of the exposure apparatus.

Primary adjustment steps are described in the following with reference to FIGS. 1 and 2. When rough assembly of the laser plasma source 16, illumination optics and projection optics PO is completed, in step S1 in FIG. 9, only the visible light AL emitted from the light source device 12 is directed to the mirror M through the wavelength selection device 30 (refer to FIG. 2). In step S2, dust particles removal and other operating conditions, such as temperature and humidity, are controlled to the standard condition, and air at atmospheric pressure is supplied to the exposure apparatus. The operator first performs rough position adjustment of projection optics PO. In this case, the operator relies on visual observation of visible light AL to roughly adjust the positions of the optical components, including the laser plasma source 16 with respect to the parabolic mirror PRM, and illumination mirror IM and loop back mirror M with respect to the parabolic mirror PRM. Such optical adjustments are performed by adjusting the supports for the various mirrors and replacement of the seats used for altering the orientation of the mirrors. Movable blind 42 and slit plate 44 are also adjusted. These steps bring the visible light AL within the arc-shaped illumination area IA (FIG. 5) on the reticle stage RST.

Next, the reticle stage RST is slowly moved in the y-direction of FIG. 4, and photo-sensors 82a of the imaging device 82 traverse the illumination area IA in y-direction of FIG. 5. The time interval of traversing photo-sensors 82a across the illumination area IA is correlated to the movement of the reticle stage RST in the y-coordinate, and the output signals are input at a high sampling rate into the main controller 80. The main controller 80 processes the series of imaging signals to determine the shape of the illumination area IA. The operator adjusts the positions and other parameters of the illumination optics and slit plate 44 so as to produce an illumination area IA conforming to a specific width H and a radius of curvature.

Next, primary adjustment of the projection optics PO is performed by moving the reticle stage RST in the y-direction of FIG. 6 so as to bring the point-shaped reflection films 83a within the illumination area IA of the visible light AL. By doing so, reduced images (point images) of the point reflection films 83a are formed on the wafer stage WST by way of the projection optics PO. By operating the wafer stage WST, the image space measuring instrument FM2 is moved to coincide with the point images so that the imaging device 86 can record the images. The operator adjusts the positions of various mirrors so that the enlarged images comply with the standards.

In the above process, the wafer stage WST may be moved in the z-direction also to record the enlarged images at several locations to perform primary adjustment of the projection optics PO. Observation of defocused point images enables to determine wave-plane aberration of the projection optics PO as disclosed in a U.S. Pat. No. 4,309,602.

Also, although point images are observed in this embodiment, visible light AL may be used to observe a periodic reflection pattern in place of point reflection films 83a. Also, instead of a planar enlarged image, a three dimensional image made by a knife edge, for example, may be used to perform image space measurements, as is explained in the Japanese Patent Application, First Publication, No. Hei 8-83753 and its corresponding U.S. Pat. No. 5,650,840. According to the present invention, therefore, there is no need to use a separate light source for primary adjustment purposes so that the assembly operation can be performed quickly at high efficiency.

Figure 9:
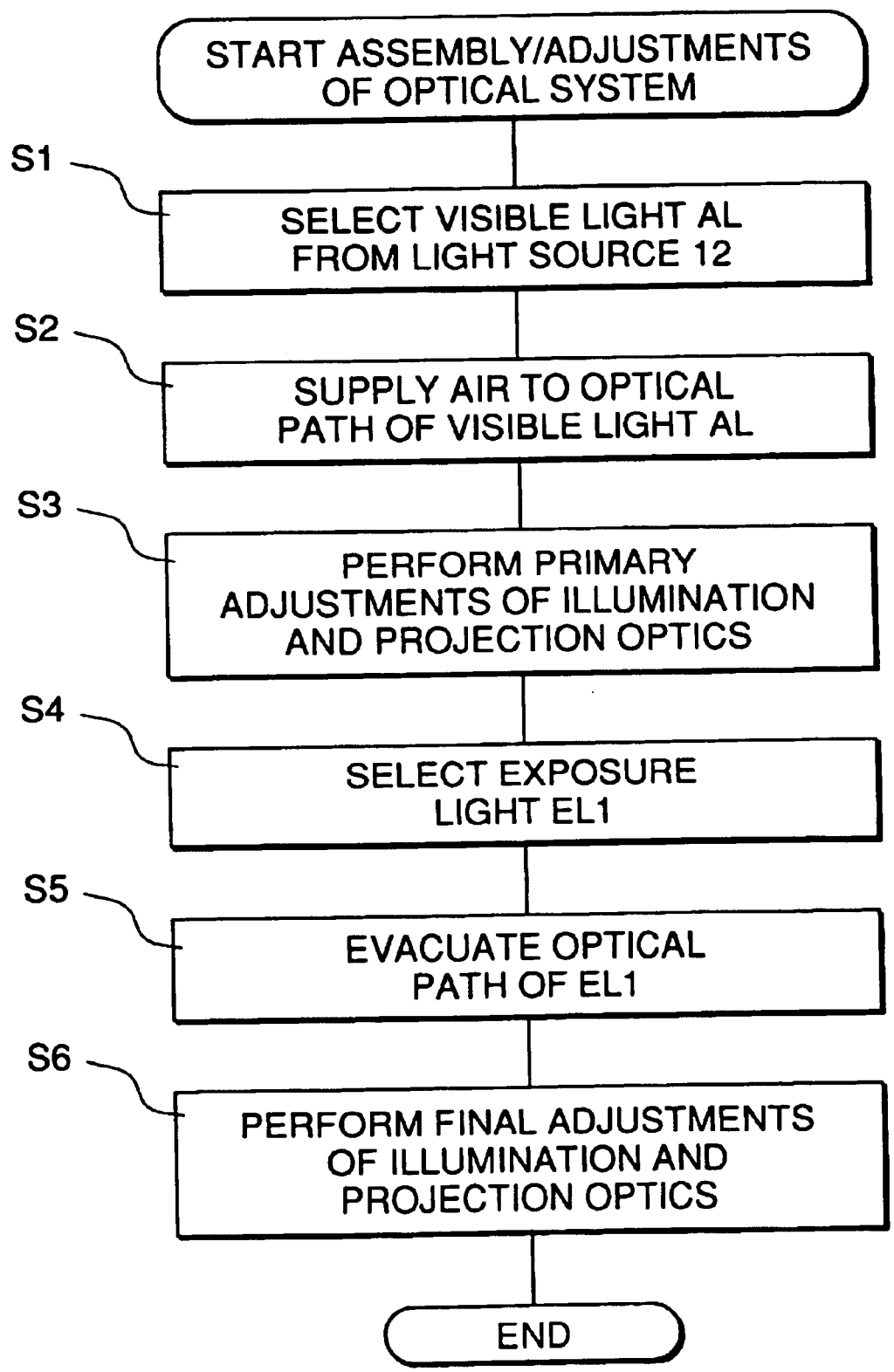
FIG. 9 is a flowchart showing an example of steps required for optical adjustments during the assembling operation.

After completing primary adjustment of the illumination optics and projection optics PO, the process moves to step S4 in FIG. 9, and using the wavelength selection device 30 shown in FIG. 2, only the EUV light EL1, emitted from the light source device 12, is directed to the loop back mirror M. In step S5, the chamber containing the exposure apparatus is evacuated so that the light path of the exposure light EL1 would have an atmosphere of specific transmissivity (attenuation of EL1 is less than a given value). In step S6, the operator performs final optical adjustment of the image forming properties of the exposure apparatus by using test methods such as test printing. For example, final optical adjustment may comprise test printing while stopping the reticle stage RST and the wafer stage WST; and test printing while synchronously scanning both the reticle stage RST and the wafer stage WST. Also, for optical adjustments, air may be admitted in the chamber as needed.

Accordingly, because both the illumination optics and the projection optics PO in this embodiment are reflective and produce no chromatic aberration, visible light AL output from the light source device 12 propagates along the same optical path as the EUV light EL1, and is able to produce test results, in the primary adjustment in step S3, that are equivalent to test using EUV light EL1. Therefore, the apparatus needs very little further adjustments in step S6 during the final adjustment phase, and the final adjustments are performed quickly and efficiently so that the overall assembly of the illumination optics and projection optics PO can be performed quickly and efficiently at high precision.

It should be mentioned that the point image observation may be performed using UV light EL2 emitted from the light source device 12.

It should also be noted that although optical adjustments are performed using the UV light or visible light from the laser plasma source 16 but such adjustments using the light emitted from the light source device 12 may be performed on a specially constructed jig. In other words, primary adjustments can be performed separately from the exposure apparatus, and after completing the primary adjustments, the components are installed in the exposure apparatus for final adjustment using the exposure light. It is permissible to use exposure light from the beginning, and visible or UV light may be used for readjustment purposes.

Next, the following explanations relate to the exposure process subsequent to the second layer using the exposure apparatus described above. First, using the wavelength selection device 30 in FIG. 2, EUV light EL1 is selected in the light source device 12, however, the emission of EUV light EL1 from the laser plasma source 16 is not performed before reticle alignment or wafer exposure. Referring to FIG. 1, a reticle transporter (not shown) transports a reticle R to the loading position, and the reticle R is held by suction on the reticle holder RH of the reticle stage RST waiting in the loading position. Also, by means of a wafer transport system (not shown) and a wafer handling device (not shown) provided above the wafer stage WST, a wafer which is coated with photo resist having sensibility to EUV light EL1 is placed on the wafer stage WST.

Next, the alignment optics ALG detects those alignment marks (one or more are provided for each shot area) that are targeted for sampling on the wafer W placed on the wafer stage WST, by moving the wafer stage WST successively. The main controller 80 adjusts the z-position of the surface of the wafer W to coincide with the focus point of the alignment optics ALG. When the detection of the alignment marks for sample shots is finished, the main controller 80 determines the array coordinates of all the shot areas by a statistical method (hereafter, this alignment method is referred to as EGA (Enhanced Global Alignment)) based on least squares using the data. Examples of the EGA method are disclosed in the Japanese Patent Application, First Publication, Sho 61-44429 and its corresponding U.S. Pat. No. 4,780,617. Or, the main controller 80, using the detected position data for the wafer alignment marks within the shot area according to a statistical method such as the one disclosed in the Japanese Patent Application, Hei 6-275496 and its corresponding U.S. patent application Ser. No. 569, 400 filed on Dec. 8, 1995, obtains all the array coordinates in all the shot area, and a size factor including projection ratio based on a statistical technique (referred to as the multi-point EGA per shot).

When the alignment measurement is completed, the magnification factor for the shot (x, y scaling) is computed, based on the shot spacing obtained by the EGA, or based on the shot size obtained by the multi-point EGA data. Then, the distance necessary to move the reticle R in the z-direction to accurately match the scaling factor in the x-direction (second direction) is computed so that the 2-D linear actuator 34 can be operated to move the reticle R in the z-direction (vertical direction of the exposure apparatus) by the amount computed. For example, if the enlargement is to be 10 ppm over the scaling factor, the reticle R is moved 40 $\mu$m away from the projection optics PO.

By moving the reticle R in z-direction as described above, the projection ratio is altered and the projection area of the reticle R is shifted, and therefore, the main controller 80 performs measurements of the baseline and the projection ratio as follows.

The main controller 80 operates the drive device 46 to switch the slit plate 44 to a position so that the exposure light EL can irradiate the alignment mark. Next, the main controller 80 operates the linear actuators 62, 34 to move the wafer stage WST and the reticle stage RST so that a pair of alignment marks, RM1, RM4, RM2, RM5, RM3, RM6 provided on the reticle R, are successively irradiated by EUV light EL1, and detected by the respective slits SLT1, SLT2 of the image space measuring instrument FM1 to determine the projection position of the reticle pattern on the wafer W. This is the process of reticle alignment.

When performing reticle alignment using the image space measuring instrument FM1, the main controller 80 moves the surface of the instrument FM1 to the focal point of the projection optics PO so that the image obtained by the instrument FM1 will be clear, by supplying the focus sensors 14a, 14b with the offset data that the reticle R is moved in the z-direction. Specifically, when the reticle R is moved 40 $\mu$m away from the projection optics PO, the projection ratio is ¼ so that the offset data given to the focus sensor 14 is 40×$\frac{1}{16}$=2.5 $\mu$m. The output signal from the focus sensor 14 is supplied to the actuator 62 in a feedback loop, to move the position of the wafer stage WST closer to the projection optics PO through a distance of 2.5 $\mu$m.

Next, the main controller 80 operates the actuator 62 to move the wafer stage WST so as to position the slit SLT1 or SLT2 of the instrument FM1 directly below the alignment optics ALG, and also adjusts the z-position of the instrument FM1 so that the surface of instrument FM1 is aligned with the focal point of the alignment optics ALG. The main controller 80 thus obtains indirectly the relative positions of the projection position of the reticle pattern on the wafer surface and the alignment optics ALG, that is, the baseline data, from detected signals output from the alignment optics ALG and the corresponding measurement data obtained by the interferometry system 70. The results are stored in the memory 81. The baseline can also be obtained by detecting a reference mark located in the middle of the slits SLT1, SLT2 and detecting the reference mark by means of the alignment optics ALG. In this case, baseline data can be obtained substantially correctly by using the detection results obtained by the alignment optics ALG and the design data for the baseline.

The projection ratio is obtained by the main controller 80 during the reticle alignment process according to the spacing of the projected images of the reticle alignment marks which are arranged in the non-scanning direction, RM1, RM4 (or RM2, RM5 or RM3, RM6) obtained on the wafer surface through the respective slots SLT1 and SLT2.

Next, the main controller 80 judges whether or not the target projection ratio adjustment (10 ppm in this case) obtained from the results of the scaling factor determination is less than the allowable residual error (0.2 ppm in this case). If it is over the allowable value, the main controller 80 returns to the step of moving the reticle R for resetting the projection ratio. The reticle R is again moved in the z-direction, and the above process is repeated. On the other hand, if the allowable value is not exceeded, the main controller 80 operates the drive device 46 to return the slit plate 44 to the position to pass the exposure light EUV light EL1 on the illumination area IA, and performs the next steps.

In the next step, the main controller 80 performs the exposure by the following step-and-scan process while using the EUV light EL1 as exposure. While monitoring the position information obtained by the interferometry system 70 according to the position data obtained for each shot area on the wafer W, the main controller 80 operates the actuator 62 to move the wafer stage WST to the start-scanning position in the first shot area, and also operates the actuator 34 to position the reticle stage RST in the start-scanning position to perform scanning/exposure of the first shot area. In this scanning/exposure process, the main controller 80 operates the actuators 34, 62 so that the ratio of moving speeds of the reticle stage RST and the wafer stage WST exactly matches to the projection ratio. Reticle pattern imprinting is thus performed by synchronizing the speeds of both stages so as to control the projection ratio of the reticle pattern in the scanning direction (y-direction). When the scanning and exposure process in the first shot area is completed, the wafer stage WST is moved to the second shot area by stepping, and to again perform the scanning/exposure process in a similar manner.

In this case, in order to eliminate the motion of returning the reticle stage RST and to increase productivity, the direction of scanning/exposure in the first shot area and the second shot area is reversed. In other words, if the fist shot is performed from "− to +" direction on the y-axis, the second shot is performed from "+ to −" direction. That is, the process is carried out by alternating the scanning. By repeating the process, stepping the motion between the shot areas and scanning/exposure within a shot area, all the shot areas on the wafer W are imprinted with the reticle pattern according to the step-and-scan method. This completes a series of steps to be performed by the exposure apparatus 10 on one wafer W.

According to this embodiment, exposure light EUV light EL1 of wavelengths in a range of 5~20 nm is used to radiate the reticle pattern using light output from the laser plasma source 16 and reflection system (PRM, IM, M), and since, in addition the projection optics PO also uses only reflective components (M1~M4), therefore, the resolution capability of the exposure apparatus is extremely high, for example, patterns such as 100 nm L/S (line spacing) can be imprinted.

Also, in the above embodiment, exposure light is EUV light EL1, but this is used for the critical layer which requires the highest degree of resolution. In contrast, it is not always necessary to use EUV light EL1 for rough layers or middle layer which do not require such high resolution. Therefore, UV light EL2 may be used when exposing on a rough layer or a middle layer, by using the wavelength selection device 30 to select a light output from the light source device 12 shown in FIG. 2. Because all the optical components are reflective type in the illumination optics and in the projection optics PO, no chromatic aberration is produced when using UV light EL2 so that process can be carried out at any desired degree of resolution, using the present illumination optics and the present projection optics PO. Therefore, the present apparatus can be used for critical layers as well as for rough layers or middle layers.

In the above embodiment, a laser plasma source 16 is used as a wide bandwidth exposure light source to generate UV light EL2 and visible light AL as well as exposure light EUV light EL1. Other potential wide bandwidth light sources include any variable wave laser sources which can generate light having a plurality of wavelengths or SOR (synchrotron orbital radiation) ring.

Although the above embodiment uses EUV light EL1 having wavelength of 5~20 nm, other wavelengths, for example 5~50 nm, may also be used. For example, when EUV light EL1 having wavelength of 30 nm is used, the precision required for the mirrors in the illumination optics and the projection optics can be lowered in comparison with the case where exposure wavelength is about 11 nm or about 13 nm.

Further, the present embodiment relates to the application of the invention to an exposure apparatus of the reduction projection type scanning/exposure apparatus, however, the present approach can also be used with the exposure light for optical adjustment purposes in a proximity type exposure apparatus that does not have a projection system.

Also, in the above embodiment, although the exposure light is EUV light EL1 which does not permeate any substances, because the image space measuring instrument FM1 comprises the fluorescent material 63 provided on the wafer stage WST, the slits SLT formed in the reflection layer 62 on the fluorescent material 63, and the photo-conversion PM for photoelectric conversion of the light emitted from the fluorescent material 63 when EUV light EL1 passes the fluorescent material 63, it is possible to measure the image space using the EUV light EL1, and the projection position of the reticle pattern on the wafer stage WST can thereby be easily determined by the image space measuring instrument FM1.

Also, in the above embodiment, slit plate 44 is used to regulate the illumination area IA, but the slit plate 44 can be omitted when the optical components contained in the illumination optics are designed to produce an arc-shaped illumination area by illumination light EL.

In addition, the illumination area IA may have a rectangular shape instead of an arcshape. When the illumination area IA is rectangular, it becomes necessary to increase the number of mirrors included in the projection optics PO in comparison with that in the present embodiment. The number of mirrors in the projection optics PO is four in this embodiment; however, it may be changed if necessary. Preferable numbers of the mirrors are 3~8 for example.

Also, the positions of the reticle alignment marks RM1~RM6 in FIG. 5 may be changed to those of RM7~RM12 shown in FIG. 5. In such a case, slit plate 44 needs to radiate only on the illumination area IA, and the drive mechanism is not required. Alignment marks may also be provided at all positions corresponding to RM1~RM12, and all alignment marks RM1~RM12 may be used.

The above exposure apparatus can be manufactured by performing optical adjustment tasks for the illumination optics and the projection optics PO as described above, and further assembling the components in order to provide electrical, mechanical, and optical connections between the components.

Wafers exposed as described above are subjected to following processes such as the following: a development process, pattern formation process, and bonding process, and devices such as semiconductor elements are manufactured.

Embodiment 2

Figure 10:
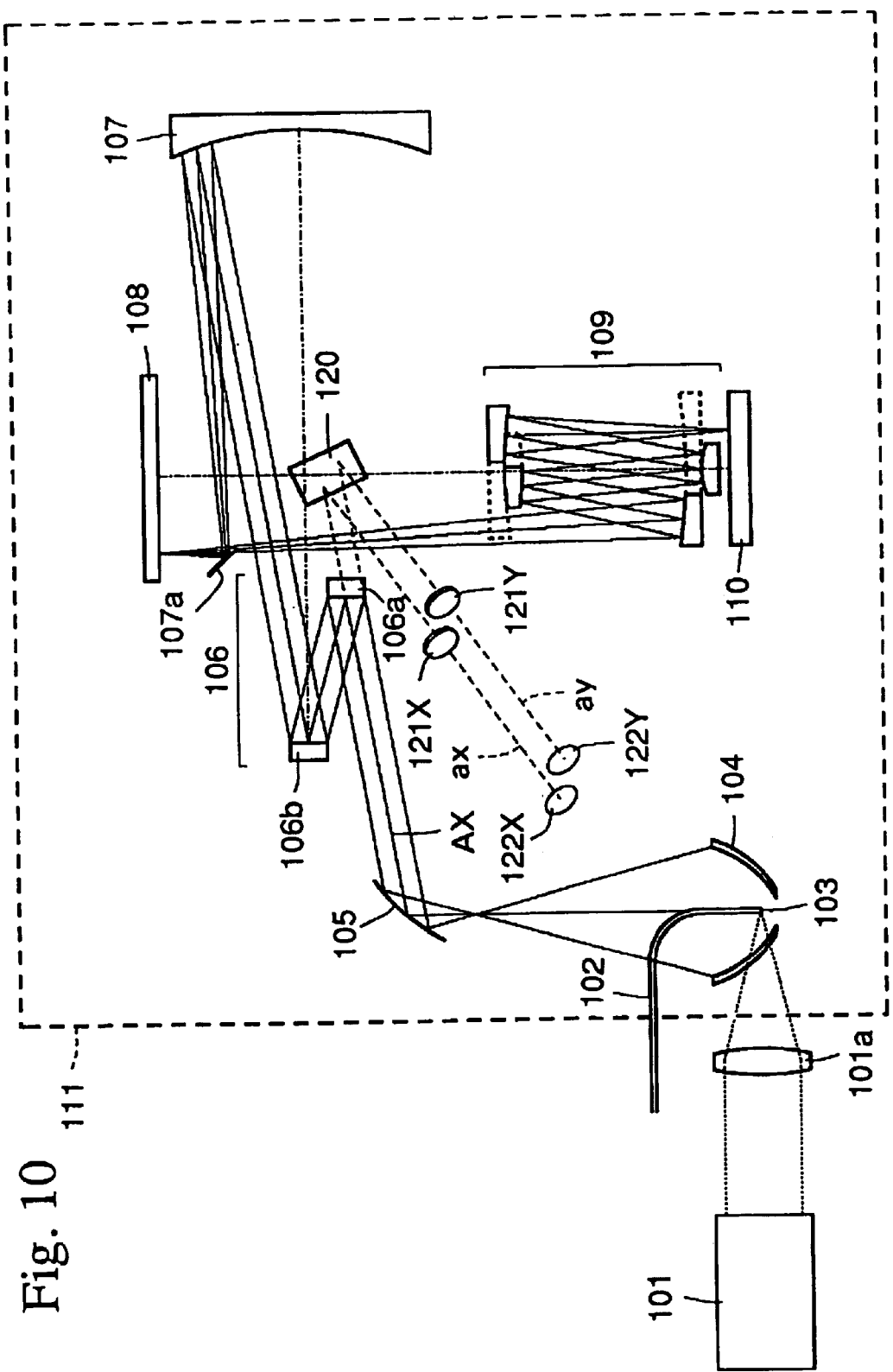
FIG. 10 is a schematic diagram of the structure of an exposure apparatus in a second embodiment.

Next, FIG. 10 shows a second embodiment of the projection exposure apparatus according to the present invention. In this embodiment, laser light in the infrared range or visible range emitted from the laser source 101 is focused by the laser light focusing optics 101 at the focal point 103. The opening of a nozzle 102 is positioned in the vicinity of the focal point 103. A target substance, for example a gaseous substance, ejected from the nozzle 102 is excited by the high intensity laser light at the focal point 103, and the center portion of the gas becomes a plasma, resulting in emission of soft x-rays and light other than soft x-rays. Therefore, the emission point of the x-ray beam is the focal point 103.

Soft x-rays (EUV light) emitted from the emission point 103 is converted to a parallel beam of light by a first focusing system 104 and a second focusing system 105. In this embodiment, the first focusing system 104 is an elliptical mirror. The second focusing system 105 is a parabolic mirror. The parabolic mirror 105 is an off-axis parabolic mirror so that the axis of rotational symmetry of the parabola does not pass through the center of the reflection surface. The emission point 103 is positioned at the first focusing point and the focal point of the parabolic mirror 105 is positioned at the second focal point.

Soft x-rays converted to a parallel beam by the focusing systems 104, 105 is led to a fly-eye optics 106. The fly-eye optics 106 is comprised by a first fly-eye optics 106a and a second fly-eye optics 106b. The component mirrors in the first fly-eye optics 106a are comprised by concave mirrors so that soft x-rays entering the first fly-eye optics 106a are divided into wave-planes by the first fly-eye optics 106a so form a plurality of secondary light sources in the vicinity of the second fly-eye optics 106b. In other words, the emission point 103 and the second fly-eye optics 106b form a conjugate relation.

In FIG. 10, although the illustration shows the parallel beam input in the first fly-eye optics 106a is reflected in parallel, in actuality, the parallel beam entering the first fly-eye optics 106a is focused at a point near the second fly-eye optics 106b.

The component mirrors in the second fly-eye optics 106b correspond to those in the first fly-eye optics 106a. The component mirrors in the second fly-eye optics 106b are also comprised by concave mirrors, the curvatures of the mirrors in the first fly-eye optics 106a are approximately the same as those in the second fly-eye optics 106b. For each of the waves produced by the first fly-eye optics 106a, the relationship between the input position and angle of each beam into the component mirrors of the first fly-eye optics 106a are converted to the output position and angle of each beam from the component mirrors of the second fly-eye optics 106b.

Soft x-rays exiting from the fly-eye optics 106 at the same exiting angle are condensed by the condenser lens 107, and after bending the optical path at the plain mirror 107a, are superimposed on the reflection mask 108. The exiting angle from the fly-eye optics 106 corresponds to individual entry angles of the component mirrors in the first fly-eye optics 106a, therefore, the illumination area on the reflection type mask 108 and the component mirrors in the first fly-eye optics 106a are in a conjugate relation. Therefore, when the illumination area of the reflection type mask 108 is an arc shape, the images on the component mirrors in the first fly-eye optics 106a are also arc-shaped.

Soft x-rays reflected selectively by the patterns fabricated on the reflection type mask 108, are led to the exposure surface 110 by the projection optics 109 to imprint the pattern on the mask 108 on the exposure surface 110. Because soft x-rays entering the reflection mask 110 and soft x-rays reflecting from the reflection mask 108 are separated in the flat mirror 107, soft x-rays entering the reflection mask 108 is slightly off telecentric. On the other hand, soft x-rays entering the exposure surface 110 is almost completely telecentric.

Also, because the transmissivity of soft x-rays through air is low, those portions of the apparatus where soft x-rays are used are housed in a vacuum chamber 111.

Light other than soft x-rays, for example visible light, emitted from the focal point 103 of the focusing optics 101a, i.e., light emission point 103 is also converted to parallel light by the focusing optics 104, 105, and are directed to the fly-eye optics 106. In this embodiment, the diameter of the light flux of the soft x-rays and visible light directed to the fly-eye optics 106 is made slightly larger than the overall diameter of the first fly-eye optics 106a. Therefore, the first fly-eye optics 106a is surrounded by soft x-rays and visible light. The soft x-rays and visible light passing through the outer periphery of the first fly-eye optics 106a is reflected by the flat mirror 120, and are focused by the first light source position observation optics 121X and the second light source position observation optics 121Y, and form respective images of the emitting light on the first screen 122X and the second screen 122Y.

These first and second screens 122X, 122Y can be observed through a window (not shown) provided on the outer wall of the vacuum chamber. The first and second screens 122X, 122Y may be provided on the outer wall of the vacuum chamber.

In this embodiment, the image of the emission point 103 is formed mostly by visible light in the peripheral light, comprised by soft x-rays and visible light, around the first fly-eye optics 106a. Therefore, the light source position observation optics 121X, 121Y may be constructed with normal lenses. Soft x-rays passing through the window of vacuum chamber 111 cannot reach to the first and second light source position observation optics because of their absorption by air. However, it is preferable to provide on the window of the vacuum chamber a film which absorbs or reflects the soft x-rays while transmitting visible light.

Figure 11:
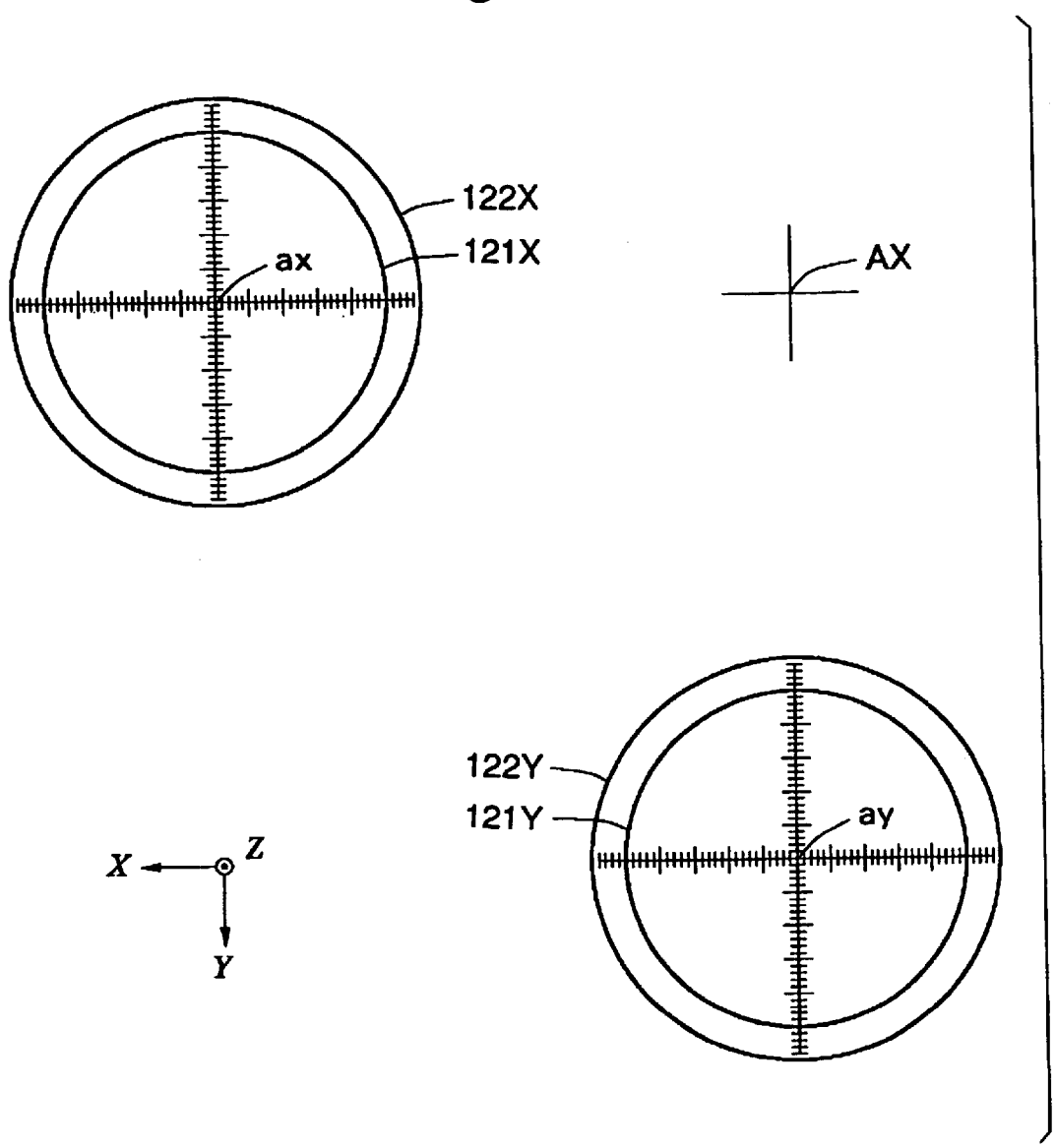
FIG. 11 is an illustration to show the locations of the optical axes of the first emission position detection system and the second emission position detection system, and gradations provided on the first screen and the second screen.
Figure 12:
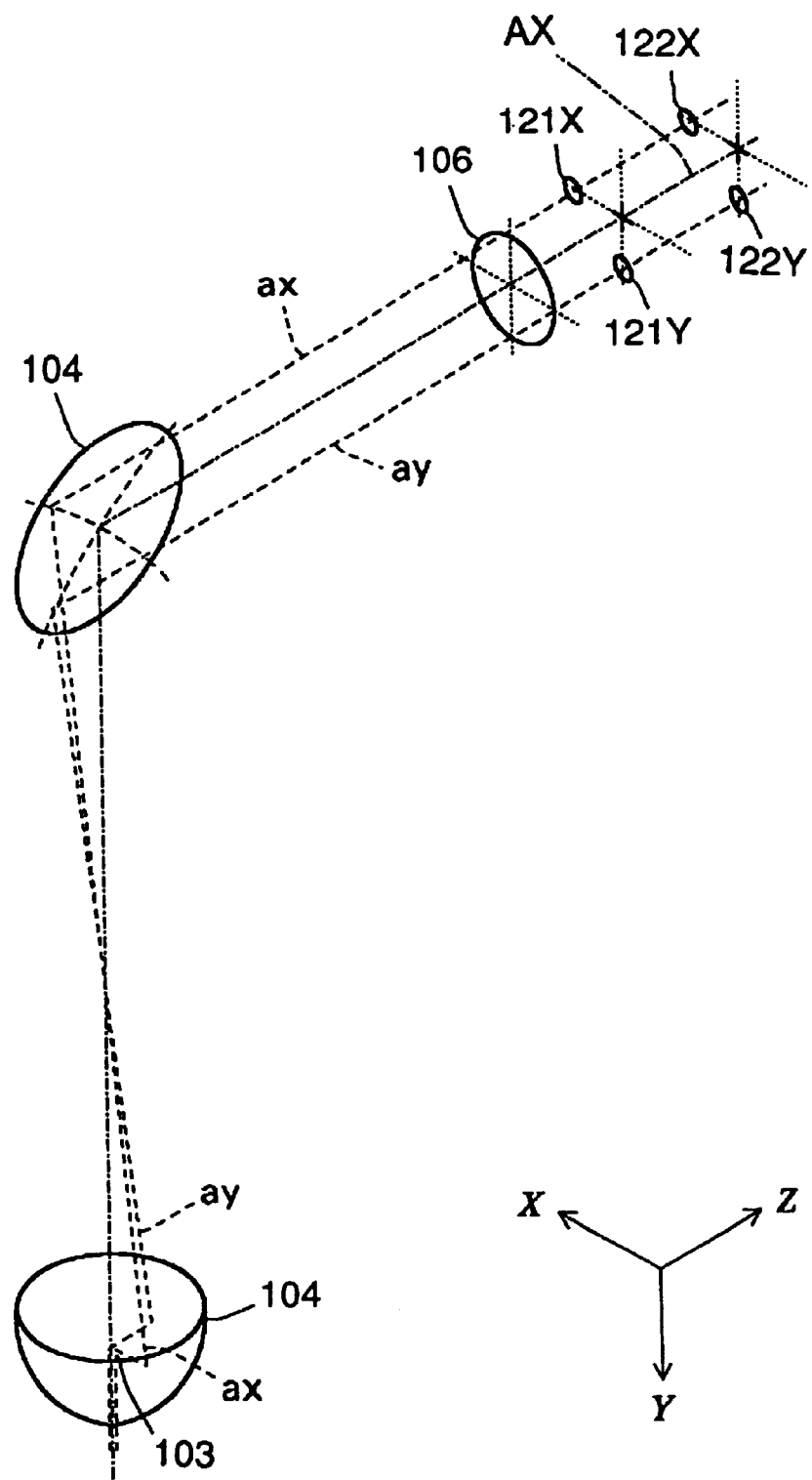
FIG. 12 is a perspective diagram showing the locations of the optical axes of the first emission position detection system and the second emission position detection system.
Figure 14:
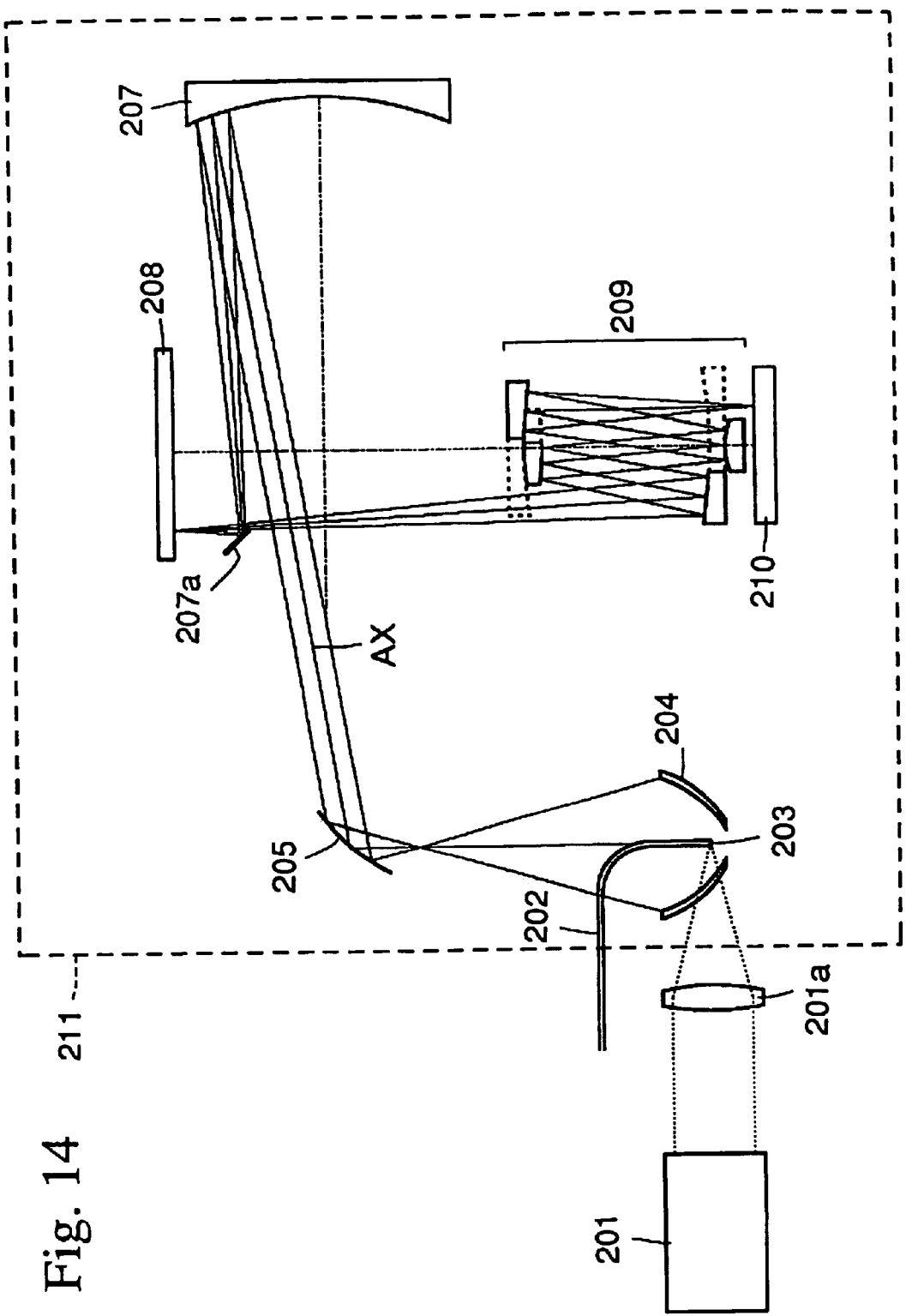
FIG. 14 is a schematic view of a conventional projection exposure apparatus.

FIG. 11 shows the light path of the light source position observation optics without the use of the flat mirror 120 to bend the light path. FIG. 12 shows a cross sectional view of the light flux directed to the fly-eye optics. In FIGS. 11, 12, AX relates to the optical axis of soft x-rays directed to the first fly-eye optics 106a, ax relates to the optical axis of the optical source observation optics 121X, ay relates to the optical axis of the second light source position observation optics 121Y. In FIG. 11, the parabolic mirror 105 polarizes the optical path in the yz plane (plane of the paper in FIG. 10) 90 degrees, but the polarizing angle is not limited to 90 degrees.

As can be seen in FIGS. 11, 12, the optical axes ax, ay of the first and second light observation optics 121X, 121Y are orthogonal about the optical axis AX of the exposure light. In other words, the first and second light source position observation optics 121X, 121Y observe the emission point 103 from two mutually exclusive directions (the x- and y-directions).

As shown in FIG. 11, indexes (graduations) are marked on the first and second screens 122X, 122Y. Therefore, the emission point 103, which is at right angles to the optical axis of the exposure light, can be positioned in three dimensions by visual observation of the images of the emission point 103 formed on the screens 122X, 122Y. In this case, the first light source position observation optics 121X specifies the position of emission point 103 on xz plane in FIG. 12, and the second light source position observation optics 121Y specifies the position of emission point 103 on xy plane.

In this embodiment, the emission point 103 is observed from two orthogonal directions, but because the emission point can be defined in 3-D by observing from any two different directions, the angle between the two directions is not limited to 90 degrees. Observation can also be made from only one direction or from three directions instead of two directions.

Also, because the transmissivity of soft x-rays is very low in air, the possibility of injury to the eye by soft x-rays is remote, however, a glass plate may be placed between the first and second light source position observation optics to further ensure safety.

In this apparatus, those parts that degrade with use and require replacement are primarily in the nozzle 102 and the first focusing optics 104. The images of the emission point 103 obtained through the first and second light source position observation optics 121X, 121Y will shift even if one of them is shifted. For this reason, by performing adjustments of positions of the images of the nozzle 102 and the first focusing optics 104 to return the image of the emission point 103 to the original positions, it is possible to accurately position the exchanged parts.

Further, it is obvious that the present invention is not limited to the above embodiment, and various modifications are possible within the scope of the present invention.

For example, in Embodiment 2, it is permissible to replace the first and second screen 122X, 122Y with respective 2-D arrays of photo-electric conversion devices such as CCDs so as to detect the position of the emission point 103 on the basis of the pixels of the CCD. Also, relay optics may be provided to re-focus the images on the screens 122X, 122Y together with the use of 2-D arrays of photo-conversion devices such as CCDs on image-formation points of the relay optics. In this case, the position of the emission point 103 is determined not in reference to the CCD, but in reference to the index graduations on the screens 122X, 122Y. Use of photo-conversion devices permits automation of detection of the emission point image and positioning of the emission point 103. In such a case, it is desirable to provide at least a drive section to control the position of the nozzle 102 in 3-D, and a control section to control the drive section according to the output signals from the photo-conversion device.

Also, in the above embodiment, the emission point image was formed by the visible light reflected by the first focusing optics, but instead, a hole may be provided in the parabolic mirror serving as the first focusing optics 104, to observe the emission point 103 through the hole. FIG. 13 shows two holes 104ax, 104ay in the x-ray focusing optics 104, and the first and second light source position observation optics 121X, 121Y operate through the holes 104ax, 104ay. In this case, the first light source position observation optics 121X is able to observe the emission point position within a plane at right angles to the optical axis ax, while the second light source position observation optics 121Y observes the emission point position within a plane at right angles to the optical axis ay. In the example shown in FIG. 13, the optical axes of the optics 121X, 121Y are not at 90 degrees but they may be made to intersect at 90 degrees. In this case also, CCD devices may be placed in the positions of the screen 122X, 122Y, or in conjugate positions to the screen 122X, 122Y.

Also, although visible light is detected by the first and second light source position observation optics 121X and 121Y in the above embodiment, it is possible to detect other light, for example UV light, other than visible light, emitted together with soft x-rays from the emission point 103.

The apparatus shown in FIG. 10 can be manufactured by incorporating the first and second light source position observation optics 121X and 121Y in the above-described exposure apparatus according to the first embodiment. The manufacturing process of the exposure apparatus shown in FIG. 1 or 10 is preferably performed in a clean room in which temperature and cleanliness are controlled. Furthermore, the manufacturing method of semiconductor devices comprises the steps of: designing semiconductor devices in consideration of the necessary function and performance; producing reticles based on the result of the device design; manufacturing wafers from silicon materials; transferring the reticle pattern on the wafers; assembling devices using the wafers (this step includes a dicing process, a bonding process, and a packaging process); and inspecting the produced devices.

In the above embodiment, the first and second light source position observation optics 121X, 121Y detect visible light, but instead, it is also possible to detect light other than visible light, for example UV light, emitted from the emission point 103 together with soft x-rays.

Also it should be noted that the present invention is applicable not only to the exposure apparatus presented in these embodiments, but also to a proximity type exposure apparatus in which the mask patterns are projected and imprinted on a photo-sensitive base micro-distanced from the mask pattern.

Further, it is permissible to suitably mix various optical configurations presented in Embodiments 1 and 2, thereby enabling the production of modified systems within the scope of the present claims that follow.

The contents of the Specifications, claims, and abstracts of both the Japanese Patent Application No. Hei 10-262791 filed on Sep. 17, 1998, and the Japanese Patent Application No. Hei 10-268197 filed on Sep. 22, 1998, are incorporated by reference in the present specification.

What is claimed is:

1. A method for performing an optical adjustment on an exposure apparatus which exposes an object with exposure light from a light source, comprising:
generating, from said light source, non-exposure light having a wavelength which is different from that of said exposure light, said non-exposure light including at least one of ultraviolet light and visible light;
adjusting an optical property of an optical system through which said exposure light passes by receiving said non-exposure light from said light source through at least a part of the optical system with a first sensor, said optical system including at least an illumination system which irradiates said exposure light onto an original;
generating said exposure light from said light source, said exposure light being incident on said optical system of which the optical property is adjusted; and
receiving said exposure light through at least a part of said optical system with a second sensor to obtain an optical property of said optical system at the wavelength of said exposure light.

2. A method according to claim 1, wherein said exposure light comprises extreme ultraviolet light having a wavelength in a range of 5 to 50 nanometers, and said non-exposure light has a wavelength longer than that of said exposure light.

3. A method according to claim 2, wherein said optical property of said optical system is adjusted while an optical path therefor is kept in an atmosphere being substantially the same as atmospheric air.

4. A method according to claim 3, wherein said optical system includes a projection system which projects an image of said original illuminated with said exposure light by said illumination system on said object.

5. A method according to claim 1, further comprising:
adjusting the optical property of said optical system based on said obtained optical property at the wavelength of said exposure light.

6. A method according to claim 5, wherein said adjustment of said optical property by receiving said non-exposure light is performed under an atmosphere being different from an atmosphere under which said adjustment of said optical property by receiving said exposure light is performed.

7. A method according to claim 6, wherein said adjustment of said optical property by receiving said exposure light is performed while an optical path therefor is kept in a substantial vacuum.

8. A method according to claim 6, wherein said exposure light comprises extreme ultraviolet light having a wavelength in a range of 5 to 50 nanometers.

9. A method according to claim 1, wherein said optical property of said optical system is adjusted under an atmosphere being different from an atmosphere under which said object is exposed.

10. A method according to claim 9, wherein said object is exposed under an atmosphere being different from atmospheric air.

11. A method according to claim 9, wherein said optical property of said optical system is adjusted while an optical path therefor is kept in an atmosphere being different from a vacuum.

12. A method according to claim 9, wherein said exposure light comprises extreme ultraviolet light having a wavelength in a range of 5 to 50 nanometers.

13. An exposure apparatus which exposes an object with exposure light, comprising:
a light source in which optical components are installed and which generates said exposure light and non-exposure light having a wavelength which is different from that of said exposure light and including at least one of ultraviolet light and visible light;
an optical system disposed on an optical path through which said exposure light passes and including at least an illumination system which irradiates said exposure light onto an original;
a first sensor that receives said non-exposure light from said light source through at least a part of said optical system and output of which is used in adjustment of an optical property of said optical system, said optical property being adjusted based on the output from said first sensor; and a second sensor that receives said exposure light from said light source through at least a part of said optical system to obtain an optical property of said optical system at the wavelength of said exposure light.

14. An apparatus according to claim 13, further comprising:
a wavelength selection device disposed between said light source and said optical system to select one of said exposure light and said non-exposure light, emitted from said light source, toward said optical system.

15. An apparatus according to claim 13, wherein said optical system includes a projection system which projects an image of said original on said object.

16. An apparatus according to claim 15, wherein said exposure light comprises extreme ultraviolet light having a wavelength in a range of 5 to 50 nanometers, and said non-exposure light has a wavelength longer than that of said exposure light.

17. An apparatus according to claim 16, wherein said first sensor receives said non-exposure light while an optical path therefor is kept in an atmosphere being substantially the same as atmospheric air.

18. An apparatus according to claim 13, wherein said first sensor receives said non-exposure light under an atmosphere being different from atmosphere under which said object is exposed.

19. An apparatus according to claim 18, wherein said object is exposed while an optical path therefor is kept in an atmosphere being different from atmospheric air.

20. An apparatus according to claim 18, wherein said first sensor receives said non-exposure light while an optical path therefor is kept in an atmosphere being different from a vacuum.

21. An apparatus according to claim 18, wherein said exposure light comprises extreme ultraviolet light having a wavelength in a range of 5 to 50 nanometers.

22. An exposure apparatus which exposes an object with exposure light, comprising:
an x-ray source that generates x-rays as said exposure light and also generates second wavelength light having a wavelength which is different from that of said exposure light; and
optical elements that miide said x-rays generated from said x-ray source to said object; and
a light source observation system that forms an image of said x-ray source with said second wavelength light generated from said x-ray source that generates x-rays as said exposure liaht and passes through said optical elements that guide said x-rays generated from said x-ray source to said object obtain positional information with respect to said x-ray source and said optical elements, said second wavelength light including one of ultraviolet light and visible light.

23. An apparatus according to claim 22, wherein said x-ray source is a laser excitation plasma source that generates said x-rays from a substance by irradiation of a laser beam.

24. An exposure apparatus according to claim 22, further comprising a first stage which supports said object and moves relative to a beam of said exposure light, wherein
said light source observation system includes an image measurement device which is disposed on said first stage and which photoelectrically detects an image of said x-ray source formed with said second wavelength light which is generated by said x-ray source and which passes through said optical elements.

25. An exposure apparatus according to claim 24, further comprising a second stage which supports a plate on which a predetermined pattern is formed and which exposes said object with exposure light based on a pattern of the plate supported on said second stage, wherein
said light source observation system is provided with a reflecting member which is disposed on said second stage and which reflects said second wavelength light emitted from said x-ray source, and
said image measurement device disposed on said first stage measures an image of said second wavelength light from said reflecting member disposed on said second stage which passes through said optical elements.

26. An apparatus according to claim 25, wherein said light source observation system includes first and second optical systems, which are positioned so as to observe said x-ray source from different directions.

27. An apparatus according to claim 22, wherein said light source observation system includes first and second optical systems of which optical axes intersect each other.

28. An apparatus according to claim 22, wherein said x-ray source is disposed inside a vacuum chamber, and said light source position observation system provides for observation of an image of said x-ray source formed by said second wavelength light from outside said vacuum chamber.

29. A method of adjusting an exposure apparatus having an x-ray source, which exposes an object with exposure light from the x-ray source which passes through predetermined optical elements comprising:
generating x-rays from said x-ray source as said exposure light;
generating second wavelength light from said x-ray source with said x-rays. said second wavelength light having a wavelength which is different from that of said exposure light and including one of ultraviolet light and visible light; and
adjusting said x-ray source and said predetermined optical elements with respect to an illumination system which irradiates said exposure light onto an original, by receiving said second wavelength light which is generated from said x-ray source and which passes through said predetermined optical elements.

30. A method according to claim 29, wherein said x-ray source is adjusted based on an image of said x-ray source formed with said generated second wavelength light.

31. A method according to claim 29, wherein said x-ray source is a laser excitation plasma source that generates extreme ultraviolet light as said exposure light.

32. A method according to claim 29, said exposure apparatus being provided with a first stage which supports said object and moving relative to a beam of said exposure light, wherein
said step of adjusting includes a detecting step of photoelectrically detecting an image of said x-ray source of said second wavelength light which is generated at said x-ray source and which passes through said optical elements using an image measurement device disposed on said first stage.

33. A method according to claim 32, said exposure apparatus being provided with a second stage for supporting a plate on which a predetermined pattern is formed and exposing said object on said first stage with exposure light according to a pattern of a plate supported on said second stage, wherein
a light source observation system is provided with a reflecting member which is disposed on said second stage and which reflects said second wavelength light emitted from said x-ray source, and said step of adjusting further comprises measuring an image of said second wavelength light of the reflecting member disposed on said second stage which passes through said optical elements using the image measurement device on said first stage.

34. A method of exposing an object with exposure light from an x-ray source which passes through predetermined optical elements, comprising:

adjusting said x-ray source and said predetermined optical elements with respect to an illumination system which irradiates said exposure light onto an original, by receiving second wavelength light which is generated from said x-ray source and which passes through said predetermined optical elements, said second wavelength light having a wavelength which is different from that of said exposure light, generated from said same x-ray source which generates x-rays used as said exposure light, said second wavelength light including one of ultraviolet light and visible light; and illuminating said original with said exposure light through said illumination system to expose said object with the illuminated original.

35. A method according to claim 34, wherein said x-ray source is a laser excitation plasma source that generates extreme ultraviolet light as said exposure light and is adjusted based on an image of said x-ray source formed with said generated second wavelength light.

36. A method of making an exposure apparatus which exposes an object with exposure light, comprising:

arranging an optical system in an optical path through which said exposure light passes, said optical system including at least an illumination system which irradiates said exposure light onto an original;

providing a light source that generates said exposure light and non-exposure light having a wavelength which is different from that of said exposure light and including at least one of ultraviolet light and visible light;

receiving said non-exposure light from said light source through at least a part of said optical system to obtain first information with respect to said optical system;

adjusting an optical property of said optical system based on said first information;

receiving said exposure light from said light source through at least a part of said optical system of which the optical property is adjusted to obtain second information with respect to said optical system; and adjusting an optical property of said optical system based on said second information.

37. A method according to claim 36, wherein said optical system is a reflective optical system comprising a plurality of reflective optical elements assembled into a barrel.

38. A method according to claim 37, wherein said exposure light has a wavelength in a range of 5 to 50 nanometers.

39. A method according to claim 36, wherein said adjustment of said optical property by receiving said non-exposure light is performed under an atmosphere being different from an atmosphere under which said adjustment of said optical property by receiving said exposure light is performed.

\* \* \* \* \*